(12) United States Patent
Weir et al.

(10) Patent No.: US 7,886,431 B2
(45) Date of Patent: Feb. 15, 2011

(54) POWER DISTRIBUTION SYSTEM FOR INTEGRATED CIRCUITS

(75) Inventors: Steve Weir, Petaluma, CA (US); Scott McMorrow, Narragansett, RI (US)

(73) Assignee: Teraspeed Consulting Group LLC, Narragansett, RI (US)

( * ) Notice: Subject to any disclaimer, the term of this patent is extended or adjusted under 35 U.S.C. 154(b) by 362 days.

(21) Appl. No.: 11/757,261

(22) Filed: Jun. 1, 2007

(65) Prior Publication Data

US 2007/0279880 A1    Dec. 6, 2007

Related U.S. Application Data

(60) Provisional application No. 60/804,089, filed on Jun. 6, 2006, provisional application No. 60/887,148, filed on Jan. 29, 2007, provisional application No. 60/887,149, filed on Jan. 30, 2007.

(51) Int. Cl.
    *H05K 3/30*    (2006.01)
(52) U.S. Cl. ..................... 29/832; 29/831; 361/794
(58) Field of Classification Search .................. 29/832; 333/164
    See application file for complete search history.

(56) References Cited

U.S. PATENT DOCUMENTS

| | | | |
|---|---|---|---|
| 5,317,290 A * | 5/1994 | Jacomb-Hood | ............. 333/164 |
| 5,812,384 A | 9/1998 | Ramakrishnan et al. | |
| 5,844,762 A | 12/1998 | Yamamura et al. | |
| 6,037,677 A | 3/2000 | Gottschall et al. | |
| 6,061,222 A | 5/2000 | Morris et al. | |
| 6,104,258 A | 8/2000 | Novak | |
| 6,215,372 B1 | 4/2001 | Novak | |
| 6,215,373 B1 | 4/2001 | Novak et al. | |
| 6,252,177 B1 | 6/2001 | Stoddard | |
| 6,418,031 B1 | 7/2002 | Archambeault | |
| 6,469,908 B2 | 10/2002 | Patel et al. | |
| 6,525,622 B1 | 2/2003 | Novak et al. | |
| 6,727,774 B1 | 4/2004 | Novak | |
| 6,788,149 B2 | 9/2004 | Mouzannar et al. | |
| 6,873,219 B2 | 3/2005 | Grebenkemper | |
| 6,903,634 B2 | 6/2005 | Chang | |
| 6,961,231 B1 | 11/2005 | Alexander et al. | |

(Continued)

OTHER PUBLICATIONS

Baudendistel: "Power Bus Decoupling on Multilayer Printed Circuit Boards," University of Missouri-Rolla Electromagnetic Compatibility Laboratory; May 1994; Report No. TR94-8-03; pp. 1-44.

(Continued)

*Primary Examiner*—Derris H Banks
*Assistant Examiner*—Azm Parvez

(57) ABSTRACT

A power distribution system for integrated circuits includes methods to damp resonance between a bypass capacitor network and a power/ground cavity of the printed circuit board that (a) does not require excessive quantities of bypass/damping components or (b) does not require high plane cavity capacitance or in the alternative can insure a Q of less than 1.4 at the transition from the bypass network to the plane cavity impedance cross-over.

14 Claims, 16 Drawing Sheets

U.S. PATENT DOCUMENTS

| | | | |
|---|---|---|---|
| 7,209,366 | B2 | 4/2007 | Prokofiev et al. |
| 7,317,622 | B2 | 1/2008 | Li |
| 7,773,390 | B2 | 8/2010 | Weir et al. |
| 2005/0141206 | A1 | 6/2005 | Radhakrishnan et al. |
| 2007/0236305 | A1 | 10/2007 | Kearns et al. |
| 2008/0002380 | A1 | 1/2008 | Hazucha et al. |

OTHER PUBLICATIONS

Hockanson et al.:"A Printed Circuit Board's Response to Decoupling Capacitors," University of Missouri-Rolla Electromagnetic Compatibility Laboratory; Mar. 27, 1992; Report No. TR92-2-005; 32 pages.

Lee et al.: "Modeling and Analysis of Multichip Module Power Supply Planes," Hewlett-Packard Company; Mar. 1994; HPL-94-32; pp. 1-26.

Downing et al.: "Decoupling Capacitor Effects on Switching Noise," IEEE Transactions on Components, Hybrids, and Manufacturing Technology; Aug. 1993; vol. 16, No. 5; pp. 484-489.

Chun et al.: "Modeling of Simultaneous Switching Noise in High Speed Systems," IEEE Transactions on Advanced Packaging; May 2001; vol. 24, No. 2; pp. 132-142.

Ricchiuti: "Power-Supply Decoupling on Fully Populated High-Speed Digital PCBS," IEEE Transactions on Electromagnetic Compatibility; Nov. 2001; vol. 43; No. 4; pp. 671-676.

Senthinathan et al.: "Modeling and Simulation of Coupled Transmission Line Interconnects Over a Noisy Reference Plane," IEEE Transactions on Components, Hybrids, and Manufacturing Technology; Nov. 1993; vol. 16, No. 7; pp. 705-713.

Paul: "Effectiveness of Multiple Decoupling Capacitors," IEEE Transactions on Electromagnetic Compatibility; May 1992; vol. 34, No. 2; pp. 130-133.

Weir et al.: "Power Distribution System for Integrated Circuits," U.S. Appl. No. 11/757,265, filed Jun. 1, 2007.

Weir et al.: "Power Distribution System for Integrated Circuits," U.S. Appl. No. 11/757,269, filed Jun. 1, 2007.

Office action dated Nov. 4, 2010 for U.S. Appl. No. 11/757,269.

* cited by examiner

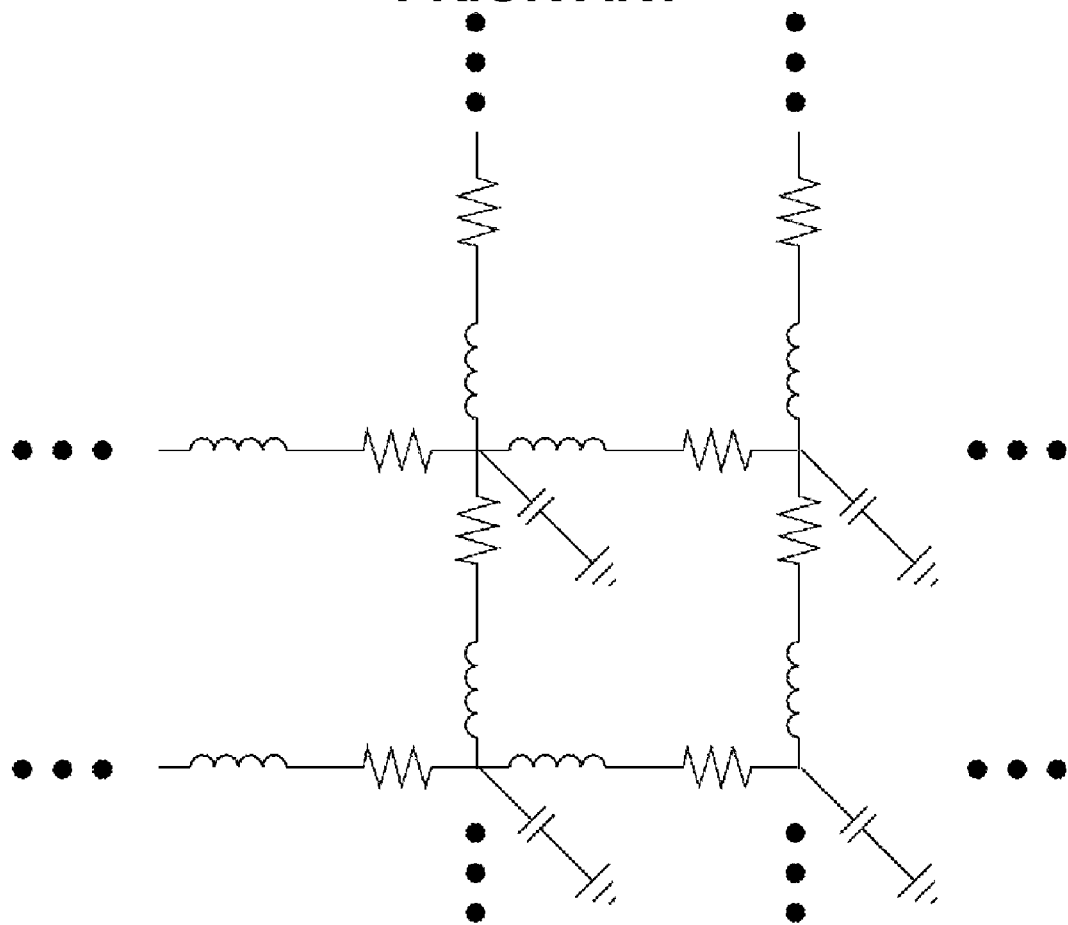

Inside Cell

Exterior Edge Cell

Exterior Corner Cell $L = u*H$
$C = e0*er*X^2/H$
$R = 2p*(1/T + K*F^{0.5})$

POWER DISTRIBUTION SYSTEM FOR INTEGRATED CIRCUITS

BACKGROUND OF THE INVENTION

1. Field of the Invention

The present invention relates to power distribution for integrated circuits (ICs). More specifically, the present invention relates to power distribution for ICs connected to printed circuit boards (PCBs).

2. Description of the Related Art

In recent years, high speed operation of electronic circuit devices has been demanded and research thereon has been carried out. Electronic circuit devices that can operate at high speed would enable the time of processing, which formerly took a long time, to be shortened drastically, would allow processing formerly considered impossible to be performed, and would make it possible to execute a large number of tasks with one device instead of multiple devices, thus reducing processing costs and contributing to development of services, facilities, functions, etc.

The supply voltage of an electronic circuit should not substantially change over time. Even though the electronic circuit's consumption of current does substantially fluctuate over short periods of time, if the supply voltage substantially changes, the electronic circuit, including ICs, will malfunction. The basic power distribution task can be simply stated as: the power distribution must support load current across the load signal spectrum while maintaining the load voltage within acceptable limits for reliable operation. If the supply voltage substantially changes, the electronic circuit, including ICs, can be unable to maintain normal operation, and the output voltage of the electronic circuit can change, making it impossible to provide normal output signals. The change of output voltage can be interpreted as noise in the output signals. If the noise is large, the electronic circuit can even malfunction.

For this reason, the power distribution system and the power wiring system are designed to have a low impedance. These systems are designed not only to have a low direct current (DC) resistance, but also to have a low impedance with respect to alternating current (AC) or high frequency signals. If the impedance of the power distribution system and power wiring system is low, even when the consumption current of the circuit fluctuates, the fluctuation of the supply voltage is small and the noise of the circuit is also small. The electronic circuit can operate normally, and therefore, the device, including the electronic circuit, operates normally.

Assuming that the impedance of the power distribution system and power wiring system is Z and that a fluctuation of the circuit's consumption current is $\Delta I$, a supply voltage fluctuation $\Delta V$ is represented by $$\Delta V = Z \cdot \Delta I$$

Because a part of this becomes a noise signal, a noise voltage $V_n$ is represented by, where k is a coefficient of 0 to 1:

$$V_{noise} = k \cdot \Delta V = k \cdot Z \cdot \Delta I.$$

As can be seen from these expressions, if the impedance Z of the power distribution system and power wiring system is small, the supply voltage fluctuation $\Delta V$ and noise voltage $V_{noise}$ are also small. Therefore, the electronic circuit, including any ICs, can operate normally.

Most current ICs make little attempt to control damping between the reactive elements in the IC, IC die, and in-package capacitance and the largely inductive path between the IC internal power connections and the remainder of the application PCB level power delivery system. Further, the total inductance is a function of individual PCB design. This leaves the cut-off frequency and the damping factor of the inherent IC package low-pass filter dependent on the application PCB design. If the PCB power delivery system impedance is inductive, and/or if the PCB power distribution system (sometimes referred to as power network wiring) resistive impedance is too low, then undesirable resonance occurs within the IC package.

Various techniques have been used to lessen the impedance of the power distribution system and the power wiring system (which will be hereinafter referred to simply as the power distribution system). These various techniques include:

1. finely spaced filter zeroes;
2. high loss dielectric;
3. high skin loss interconnect;
4. using high equivalent series resistance (ESR) capacitors;
5. using bypass capacitors;
6. increasing cross-section of power wires; and
7. distributed RC networks to damp the inherent poles.

The use of finely spaced filter zeroes is discussed by Larry Smith and is essentially an implementation of techniques described by Baudendistel, in "Power Bus Decoupling on Multilayer Printed Circuit Boards", TR94-8-023, University of Missouri-Rolla Electromagnetic Compatibility Laboratory, May 1994, which is discussed below.

High loss dielectric is an insulator material used in power wiring that absorbs energy by way of the work done by a changing electric field turning molecular dipoles in the high loss dielectric material. It appears as a frequency dependent resistance across the power rails, absorbing more energy at high frequency than at low frequencies. This is discussed, for example, in Novak '258 (U.S. Pat. No. 6,104,258) and Novak '774 (U.S. Pat. No. 6,727,774), discussed below.

High skin loss increases the power wiring impedance. On the one hand, this decreases the power distribution system's ability to deliver current, locally increasing the noise amplitude. On the other hand, because high skin loss is dissipative, it suppresses resonance in the power wiring network and suppresses noise propagation.

High ESR capacitors flatten the impedance of a given capacitor and provide dissipative shunt loss. For a signal spectrum with a flat maximum amplitude, a network with a constant impedance ideally results in peak to peak noise one half of a network with the same high frequency impedance, but where the impedance at middle or low signal frequencies is much lower, for example, at a ratio of 5:1, than at high frequencies. The relationship of lower impedance at low frequency(s) versus higher frequency gives rise to a noise high-pass function. The application of a pulse to a high pass filter where the pulse is substantially longer than the filter's time constant affects proximate differentiation of the noise pulse. The noise consists of an impulse at the leading edge, and an impulse at the trailing edge, each of similar magnitude set by the high frequency shunt impedance. For a pulse significantly longer than the filter time constant, the leading impulse recovers close to zero prior to the opposing impulse. When the impedance is constant, the response is simply that of a scalar, deflecting from zero for the duration of the pulse and recovering to zero at the end of the pulse. When the ESR of a capacitor is high, the ESR dominates capacitor impedance over a broad frequency range and makes it easier to avoid the high pass noise filter characteristic common to filters made with low ESR capacitors.

A technique of using bypass capacitors and a technique of increasing a cross-section of the power wiring are widely used prior art techniques.

A bypass capacitor is a capacitor of substantial capacity connected between two power wires. Power is always supplied on two or more wires, such as 5 V (volts) and ground; the bypass capacitor is connected between the two wires. If three or more wires, such as 5 V, 3 V, and ground, are used, the bypass capacitor is connected between two wires such as the 5 V wire and ground or the 3 V wire and ground. The bypass capacitor is often connected between ground and other wires, but it is not necessary to provide for all combinations of wires.

A theoretical capacitor, which by its nature has an impedance that decreases as frequency increases, has an effect of reducing the impedance of the power distribution system in alternating current or high frequency signal situations. A theoretical inductor, which by its nature has an impedance that increases as frequency increases, has an effect of increasing the impedance of the power distribution system in alternating current or high frequency signal situations. Therefore, at equal cost and complexity, it is desirable to construct the power distribution system so as to not exhibit any significant inductive characteristic within the load current spectrum.

Normally, in a power distribution system, a voltage regulator unit (alternatively, a voltage regulator module (VRM)) and an electronic circuit, including any ICs, are connected by electric wiring. A typical arrangement of the power distribution system is shown in FIG. 11. An IC package 10 and a voltage regulator module 13 are mounted on a PCB 12. The IC package 10 includes a die 11.

A power distribution system impedance for an alternating current or high frequency situation viewed from the electronic circuit increases because of the inductance of the wiring connecting the electronic circuit and the power distribution system. Then, when a bypass capacitor is connected near the electronic circuit, the power distribution system impedance viewed from the electronic circuit decreases. Particularly, for high speed electronic circuits, the high frequency characteristic of the power distribution system impedance must be low.

A bypass capacitor typically is located very near the electronic circuit for decreasing the inductance between the electronic circuit and the bypass capacitor. When a plurality of electronic circuits exists, a bypass capacitor typically is provided sufficiently close to each electronic circuit or for each group of a small number of electronic circuits. This power distribution system impedance reduction technique using bypass capacitors reduces the power distribution system impedance for alternating current or high frequency signals as viewed from the electronic circuit, although the impedance of the wiring connecting the electronic circuit and the power distribution system remains unchanged and in many cases dominates the power distribution impedance.

Another power distribution system impedance reduction technique is to increase a cross-section of the power distribution wiring in order to reduce power distribution wiring inductance and power distribution system impedance. To effectively carry out this technique, the power distribution wiring is often made wide, specifically, in the shape of a plane. For example, with printed circuit boards and other similar devices, a multilayer structure is adopted to provide a power distribution layer, and the power distribution wiring in this power distribution layer is made flat. Often, through holes are required for connecting parts and wires, and the plane of the power distribution layer is perforated like a mesh. Generally, because at least one of the power distribution wires is ground, ground is also contained in the power distribution wiring.

If the power distribution wiring is formed like a plane, the inductance of the power distribution wiring in the circuit board and that of the power distribution wiring between the bypass capacitor and electronic circuit can be lowered drastically, enabling reduction of the power distribution system impedance for alternating current or high frequency signals.

Another technique is to reduce the spacing between the power distribution wires (vertical separation in the case of planar wires) to reduce the inductance, which is similar to the technique of reducing the inductance by increasing the width of the power distribution wires.

The two power distribution system impedance reduction techniques, increasing the cross-section of the power wiring and reducing spacing between power distribution wiring, described above can be used in combination and often are used in combination. These techniques are compatible with each other for reducing the power distribution system impedance.

Prior art techniques also include gross application of distributed R-L-C networks that attempt to realize a net flat to low-pass noise transfer function for power distribution systems that rely upon power planes.

Baudendistel ("Power Bus Decoupling on Multilayer Printed Circuit Boards," TR94-8-023, University of Missouri-Rolla Electromagnetic Compatibility Laboratory, May 1994) discloses how to determine values of damping elements used to suppress power distribution system resonances, which cause high impedances within the power distribution bandwidth. For low frequencies where the impedance of the power plane cavities ($L_{PLN}$) is low and where the resistance of the plane ($R_{PLN}$) is also low, Baudendistel uses a simple one-dimensional approximation to estimate power distribution system behavior up to the resonance between the bypass capacitor network and any power plane cavity.

Baudendistel's model consists of n parallel RLC branches as shown in FIG. 1. The relationship between the frequency and the impedance, Z, based upon this model is shown in FIG. 2. Each branch represents the parallel aggregate for a particular capacitor value. Each parameter, $R_{VALi}$, $L_{VALi}$, and $C_{VALi}$, where i=1, ..., n, represents the parallel equivalent of the respective value from each device. For example, given ten instances of 1 µF, 2 mΩ, 1 nH capacitors, the branch is represented by a 10 µF, 0.2 mΩ, 0.1 nH capacitor. The parallel plate capacitance of the power/ground wiring cavity is represented by a single capacitor, $C_{PLN}$.

As seen in FIG. 3, Baudendistel reduces the peaks of the resonances by increasing the magnitude of the resistance, Rx, with respect to the corresponding inductance, Lx, where x is one of 1, ..., n, so as to flatten the impedance transitions from the region in which the impedance is dominated by the $(n-1)^{th}$ inductor (the region that has an upward slope approximated by $j\omega L_{VALn-1}$) to the region in which the impedance is dominated by the $n^{th}$ capacitor (the region that has a downward slope approximated by $1/(j\omega C_{VALn})$).

Baudendistal enumerates impedance equations for each branch and branches in parallel. Except for the voltage regulator module, VRM, each branch exhibits a series resonant frequency, SRF. The VRM interacts primarily with the branch that has the lowest SRF. At a sufficiently high frequency, the inductive reactance $j\omega L_{VRM}$ crosses $R_{VRM}$, as seen on the left side of FIG. 2. The impedance increases to the point where $j\omega L_{VRM} = 1/j\omega C_{VAL1}$. Impedance then decreases until the zero where $1/j\omega C_{VAL1} = j\omega L_{VAL1}$. The residual impedance at this zero is $R_{VAL1}$. This is best understood by examining the following equation for a given component:

$$Z_{equivalent} = R_{equivalent} + j(\omega L_{equivalent} - 1/\omega C_{equivalent})$$

where $Z_{equivalent}$ is the total equivalent impedance, $R_{equivalent}$ is the equivalent resistance, $L_{equivalent}$ is the equivalent inductance, $C_{equivalent}$ is the equivalent capacitance, j is the imaginary number $\sqrt{-1}$, and ω is the angular frequency in radians/second. As the frequency increases, $j\omega L_{VAL1}$ quickly dominates, increasing the impedance until the pole where $j\omega L_{VAL1}$ crosses $1/j\omega C_{VAL2}$. The impedance modulates between zeroes and poles until the last pole at $\omega = (L_{VALN}*C_{PLN})^{-0.5}$. The extent of impedance modulation depends on the relative quality factor at each zero and pole. The Q factor is the ratio of the inductive reactance to the resistive impedance at the respective pole or zero. A lower Q factor results in less modulation, while a higher Q results in more modulation.

Baudendistal teaches suppression of the impedance peaks at the poles by one or more of the following techniques:

1. Decreasing the series inductance in a given branch or branches;
2. Increasing the series resistance in a given branch or branches; and
3. Increasing the capacitance in the higher frequency branch of a two branch pair forming a pole, thus decreasing the frequency of the pole and jωL.

Lee et al. ("Modeling and Analysis of Multichip Module Power Supply Planes," IEEE Transaction on Components, Packaging and Manufacturing Technology; Part B, Vol. 18, No 4, November 1995) refines the model of Baudendistel by including the distributed effects of the power plane cavities and by including the modal resonances, which are shown on the right hand side of FIG. 7, of the power plane cavities that result from wave reflections at the cavity's boundaries. Specifically, Lee et al. discretizes the power planar cavity into an array of cells as seen in FIGS. 4, 5A-5D, and 6. The cell size is selected to be small compared to the wavelength of the highest frequency of interest (e.g., $\frac{1}{10}^{th}$ wavelength of the highest frequency of interest or less) in the power distribution system. The cell is then represented either by an equivalent network of resistances, inductances, and capacitances as shown in FIGS. 5A-5D or by a square formed by four intersecting transmission lines as shown in FIG. 6. Lee et al. further suppresses resonances by using thin film materials that exhibit high capacitance and significant distributed damping resistance, i.e., the resistance is distributed over the spatial extent of the structure, as opposed to contained in a localized region or discrete component.

Lee et al. first offers a model using R-L-C equivalents as shown in FIG. 4. Lee et al. derives the inductance and capacitance values from the Telegrapher's Equations. Lee et al. defines three types of cells: interior, edge, and corner as seen in FIGS. 5A-5C.

For computational economy, Lee et al. offers a similar model based on meshed transmission lines, as seen in FIG. 6.

Lee et al. utilizes transmission lines with an impedance of $Z_{INT} = \sqrt{2}*(L/C)^{0.5}$ inside the outer perimeter and transmission lines with twice the $Z_{INT}$, $2*\sqrt{2}*(L/C)^{0.5}$, around the outer perimeter.

At each interior junction, four lines propagate energy away from any instant source, resulting in an impedance of:

$$Z_{INT\_JUNC} = (L/(8C))^{0.5} = H/X*(\mu/(8\epsilon))^{0.5}.$$

At each external junction along an edge, the impedance is twice $Z_{INT\_JUNC}$:

$$Z_{EDG\_JUNC} = 2*Z_{INT\_JUNC} = H/X*(\mu/(2\epsilon))^{0.5}.$$

At each corner, the impedance is four times $Z_{INT\_JUNC}$:

$$Z_{CORNER} = 4*Z_{INT\_JUNC} = H/X*(2\mu/\epsilon)^{0.5}.$$

These impedance values account for neither the loading caused by any attached components nor the density variation caused by arrays of via anti-pads, where anti-pads are perforations in the planes that provide separation between the planes and conductor vias passing through, but not connecting to, those planes.

Novak '258 (U.S. Pat. No. 6,104,258) teaches the addition of termination networks along the perimeter of the cavity defined by the power wiring as a means to match the cavity's interior impedance at the edges so as to suppress the reflections and the resulting modal resonances in the power wiring. Novak '258 teaches that to be effective, the mounted inductance of termination networks should be no more than 0.2 times the inductance of the region terminated.

Novak '258 discloses that the impedance depends on the geometry, permittivity, and permeability of the cavity alone. However, Novak '258 does not account for the loading of the bypass and/or the active components. In situations where the board level components substantially load the power cavity impedance or where the frequency is above the first modal resonance, the method taught by Novak '258 does not match the impedance and will allow substantial reflections.

Instead of the edge termination method taught by Novak '258, Yamamura et al. (U.S. Pat. No. 5,844,762) discloses a distribution of damping elements 14 connected to transmission lines 15 substantially throughout the entire printed circuit assembly, as seen in FIGS. 8A and 8B. Yamamura et al. teaches that an even distribution is ideal.

It can be seen that Yamamura et al. can successfully address branch resonances taught by Baudendistel by merely following Baudendistal's teachings. It can be seen from Lee et al. that Yamamura et al. fails to address the root cause of modal resonances of the power/ground cavity(s): mismatched impedance at the edge boundaries. It can also be seen from Lee et al. that Yamamura et al. can successfully suppress modal resonances in cases where the damping element impedance is both substantially less than the characteristic impedance of the meshed transmission lines and substantially resistive.

By contrast, Novak '258 and Novak '774 (U.S. Pat. No. 6,727,774) teach that to suppress modal resonances, it is sufficient to add termination networks substantially along the PCB boundary so as to match the peripheral impedance to the internal impedance of the plane cavity(s). In doing so, Novak '258 and Novak '774 suppress modal resonances with far fewer components and expense than Yamamura et al.

However, similar to Yamamura et al., Novak '258 and '774 both rely upon achieving a low inductance in the damping elements compared to the plane cavity itself. Novak recites a target inductance in the termination networks of no more than:

$$0.2*\mu_0*\mu_R*H$$

where $\mu_0$ is the permeability of free space (approximately $31.9 \times 10^{-9}$ webers/ampere), $\mu_R$ is the relative permeability of the conductors (generally 1.0 webers/ampere or very close to 1.0 webers/ampere), and H is the dielectric thickness within the plane cavity.

For example, given a cavity with a dielectric thickness of 0.001", the target inductance would need to be $<0.2*31.9 \times 10^{-9}$ webers/ampere*1 webers/ampere* 0.001 in=6.4 pH. If implemented using common capacitors and if using the planes near the surface of the PCB, the mounted inductance of each capacitor could be about 1 nH, requiring about 160 components. For the case of a power/ground cavity further from the surface of the PCB, such as occurs in a number of complex assemblies, the mounted inductance of each capacitor can be twice as high, requiring double the number of capacitors.

As can be understood from Lee et al., well within an unloaded cavity perimeter, the impedance closely follows:

$$Z_{INT\_JUNC} = H/X * (\mu/(8\epsilon))^{0.5}.$$

Well away from the corners along the edges, the impedance closely follows:

$$Z_{EDG\_JUNC} = H/X * (\mu/(2\epsilon))^{0.5} = 2 * Z_{INT\_JUNC}.$$

At each corner, the impedance closely follows:

$$Z_{CORNER} = H/X * (2\mu/\epsilon)^{0.5} = 4 * Z_{INT\_JUNC}.$$

As seen in FIG. 9, a dissipative element 17 with resistive impedance of $Z_{EDG\_TERM} = Z_{EDG\_JUNC}$ (where $Z_{EDG\_TERM}$ is the impedance of the dissipative element located on the boundary edge, but not at the corner) is connected to the edge of the transmission lines 18 and nominally reduces the impedance along the boundary edge by half, and thereby matches $Z_{INT\_JUNC}$. In the case of an unloaded, rectangular cavity, this leaves reflections only from the impedance mismatch in the corners where cavity impedance is twice as high as in the center of a given edge.

In order to compensate for the corners, as seen in FIG. 9, the dissipative element 16 is connected to the corner of the transmission lines 18 and must assume a value that is not only substantively lower than the characteristic impedance of the corner itself, but also lower than the impedance in the center of each adjoining edge. Thus, the impedance of the dissipative element 16 located at the corner ($Z_{CORNER\_TERM}$) should be:

$$Z_{CORNER\_TERM} = 1/((X/H * (\mu/(8\epsilon))^{-0.5}) - (X/H * (2\mu/\epsilon)^{-0.5}))$$
$$= 4/3 * Z_{INT\_JUNC}$$
$$= 1/3 * H/X * (2\mu/\epsilon)^{0.5}.$$

This formula is derived by solving for the parallel impedance in the corner required to maintain a uniform impedance along the boundary.

When uniformly distributed, it can be seen that any bypass components create frequency dependent alterations in the power distribution system impedance. For frequencies below those where the distance is a substantial fraction of the wavelength in the effective dielectric medium, the distributed bypass and wiring networks can be modeled as simpler one-dimensional branches, similar to the model of Baudendistel.

The most troublesome resonance is the transition between the highest frequency R-L-C branch and the lumped power/ground cavity capacitance. For most PCBs, a model of which is shown in FIG. 10 (where transmission lines 19, bypass elements 20, and IC load 21 are modeled), power/ground cavity capacitance is very limited and set by:

$$C = Area/Height * \epsilon_0 * \epsilon_R$$

where C is the capacitance in Farads, Area is the plane cavity surface area, Height is the plane cavity thickness, $\epsilon_0$ is the permittivity of free space, and $\epsilon_R$ is the relative permittivity of the dielectric material in the plane cavity.

Example capacitances per square inch and impedances for four square inches, which would be typical of a board section occupied by a sizable IC, of a board at several frequencies using typical PCB dielectrics are shown in the following table:

| | | | Z in Ohms @ F in MHz, 4 inches square | | | |
|---|---|---|---|---|---|---|
| H | $\epsilon_R$ | C/sq in | 100 | 200 | 500 | 1000 |
| 0.040 | 4.0 | 22.5 pF | 17.7 | 8.85 | 3.54 | 1.77 |
| 0.010 | 4.0 | 90.0 pF | 4.42 | 2.21 | 0.88 | 0.44 |
| 0.004 | 4.0 | 225 pF | 1.77 | 0.88 | 0.35 | 0.18 |
| 0.002 | 4.0 | 450 pF | 0.88 | 0.44 | 0.18 | 0.09 |
| 0.001 | 4.0 | 900 pF | 0.44 | 0.22 | 0.09 | 0.04 |

A cavity height of 0.040" is typical for low cost four or six layer construction. Cavity heights of 0.004" are typical for processing of complex fiberglass reinforced PCBs.

Given a uniform or nearly uniform distribution throughout a network of bypass capacitors exhibiting a fixed mounted inductance, the transition frequency between the bypass capacitor network and the power/ground cavity of the PCB depends on the following parameters:

1. $L_{CAP\_MOUNTED}$, the mounted inductance of each bypass capacitor;
2. P, the areal density of bypass capacitors;
3. $C_{PLN\_SQ\_IN}$, the capacitance per unit area of the power/ground cavity;
4. $F_{RES} = P^{0.5}/(2*\pi*L_{CAP\_MOUNTED}^{0.5} * C_{PLN\_SQ\_IN}^{0.5})$;
5. $Z_{CHAR} \approx L_{CAP\_MOUNTED}^{0.5}/(C_{PLN\_SQ\_IN}^{0.5} * P^{0.5})$; and
6. $Z_{RES} \approx L_{CAP\_MOUNTED}/(R_{CAP\_MOUNTED} * C_{PLN\_SQ\_IN})$;

where $F_{RES}$ is the resonant frequency, $Z_{CHAR}$ is the characteristic impedance of the reactive network consisting of the mounted bypass capacitors and the lumped representation of the power wiring capacitance, and $Z_{RES}$ is the peak impedance at the pole formed from the bypass capacitor network and the lumped power wiring capacitance.

Increasing the bypass capacitor density increases the resonant frequency and decreases the characteristic impedance of the pole formed between the bypass capacitor network and the power/ground cavity of the PCB. However, increasing the capacitor density also reduces resistance per unit area, which increases the impedance peak with respect to the characteristic impedance, i.e., the circuit Q factor is increased.

The prior art methods that have been used to limit $Z_{RES}$, or the impact of $Z_{RES}$, include:

1. Increasing the gross density of the bypass capacitors with matching series resistance so as to limit the circuit Q factor, which is described by Baudendistel, Yamamura et al., Novak '258, and Novak '622; or
2. Increasing the capacitance of the power plane cavity.

Each of these methods has serious drawbacks. In the first method, the number of components required can become large, particularly for thick printed circuit assemblies where the distance from the mounting surface of the capacitors and the planes and associated mounted inductance loop can be large.

The second method requires use of expensive and sometimes difficult to handle thin and/or high permittivity dielectric materials. A subtle, potential disadvantage of the second method is that it reduces the resonant frequency between the bypass capacitors and power/ground cavity.

Lee et al. enumerates distributed element modeling of a power distribution system using a two dimensional grid of either discrete R-L-C-G element cells or meshed transmission lines. In a power distribution system model incorporating both Baudendistel and Lee et al., the aggregate bypass capacitor network aggregates to a single R-L-C branch for each value of capacitor used. The value for R is the parallel mounted ESR of all capacitors of the particular value forming the branch. The value for L is similarly the parallel mounted capacitor inductance. Finally, C is the parallel capacitance of the capacitors in the branch.

It can be seen from this model that in order for each damping element to be effective at frequencies where $L_{PLN}$ is significant, the inductance of the damping element, $L_{DAMP}$, must be small in relation to $L_{PLN}$. Lee et al. shows that modal resonances occur at frequencies where $L_{PLN}$ is significant.

In the prior art, interposers and modules have been used as component carriers for mechanical, space, and modularity reasons. For example, Alexander et al. (U.S. Pat. No. 6,961, 231) discloses an interposer for use with an IC. However, Alexander et al. uses the interposer merely as a means of providing capacitance to supplant the power system. Alexander et al. does not use the interposer to reduce power system impedance, to detune power system resonance, and to redistribute input/output (I/O) to reduce noise injection into the PCB power wiring network caused by discontinuous return paths. The decoupling of the Alexander et al. interposer simply provides some non-specific amount of capacitance. The resonant impedance of two parallel branches is theoretically unaffected by the capacitance of the lower frequency branch. Increasing the capacitance of that branch does not help reduce the troublesome resonance. Adding capacitance to the interposer is only beneficial in reducing resonance between the next lower frequency branch and the interposer. What constitutes that next lower branch depends on both the interposer design and the attached components, such as packaged IC, discrete capacitors, and/or unpackaged IC dice. As such, the additional capacitance disclosed by Alexander et al. may be of little or no benefit to power distribution impedance.

A final problem not recognized or addressed in the prior art is the loading effects of bypass devices and IC loads on the power distribution system. The prior art relies upon a presumption that the power distribution system impedance is low compared to the devices served. As device performance increases in frequency and power, establishing such a distribution system becomes difficult and costly, if not impossible.

SUMMARY OF THE INVENTION

To overcome the problems described above, the preferred embodiments of present invention provide isolation of the reactive impedance interdependencies of multiple ICs connected to a common power distribution system, match impedance to IC loads, and effect lower power distribution impedances across wider frequency ranges than currently available.

The preferred embodiments of the present invention extend beyond Novak '258 and '774 by loading a cavity boundary with dissipative elements such that the impedance at the boundary remains substantively uniform with the impedance well within the boundary. This contrasts with Novak '258 where dissipative elements are used to match the average unloaded cavity impedance and with Novak '774, which calculates cavity impedance based on plane separation, dielectric permittivity, and cavity perimeter without considering the loading effects of the bypass capacitors and active circuits.

The preferred embodiments of the present invention provide methods to damp resonance between a bypass capacitor network and a power/ground cavity of the PCB that:

1. Does not require excessive quantities of bypass/damping components; or
2. Does not require high plane cavity capacitance or in the alternative can insure a Q of less than about 1.4 at the transition from the bypass network to the plane cavity impedance cross-over.

The preferred embodiments of the present invention are capable of achieving one or more of the following:

1. Isolating the reactive impedance interdependencies of multiple integrated circuits connected to a common power distribution system;
2. Presenting a matched impedance to IC loads; and
3. Effecting lower power distribution impedances across wider frequency ranges than currently available.

Other features, elements, characteristics, steps and advantages of the present invention will become more apparent from the following detailed description of preferred embodiments of the present invention with reference to the attached drawings.

BRIEF DESCRIPTION OF THE DRAWINGS

FIGS. 1-11 illustrate prior art techniques.

DETAILED DESCRIPTION OF PREFERRED EMBODIMENTS

Techniques Used in Optimizing the Power Distribution System

Figure 12:
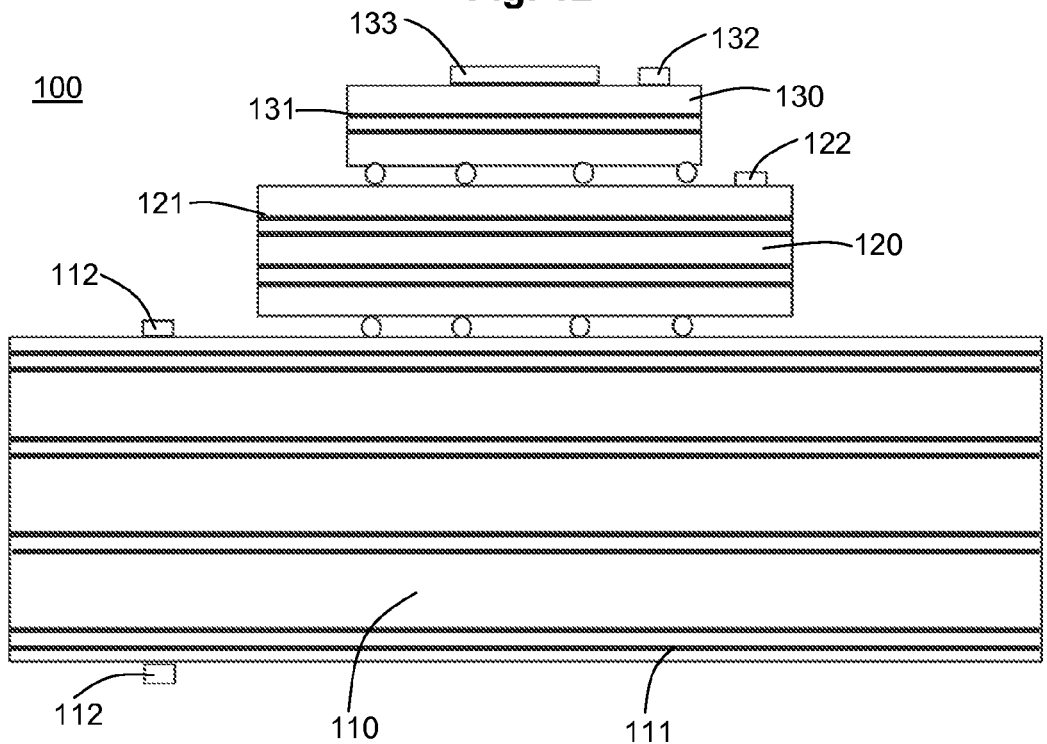
FIG. 12 illustrates an interposer according to a preferred embodiment of the present invention.

As shown in the power distribution system 100 of FIG. 12, the pairs of power and ground planes 111 of the PCB 110 can be paired together to take advantage of mutual inductance and interplane capacitance. The mutual inductance of the power and ground planes 111 of the PCB 110 reduces overall the inductance of the power distribution path. The reduction of inductance of the power distribution path increases the power distribution bandwidth. The interplane capacitance of the power and ground planes 111 of the PCB 110 provides a small amount of energy storage, but interacts with the other parallel inductances in the power distribution system 100. This is a critical parameter at high frequencies.

Capacitors 112 on the PCB 110 provide for energy storage in the power distribution system 100. Capacitors 112, 122, and 132 can be mounted on a substrate, including the PCB 110, the interposer 120, and the IC package 130, or can be embedded in a substrate. Capacitors 112, 122, and 132 can also be mounted on the top or the bottom of the PCB 110, the interposer 120, or the IC package 130.

Capacitors 112, 122, and 132 inherently have some amount of inductance and resistance, along with capacitance, associated with their designs. The inherent inductances and resistances of the mounted capacitors must be taken into account when optimizing power distribution. Capacitors 112, 122, and 132 are generally mounted to substrates with metal pads and vias. Capacitors 112, 122, and 132 have inductance associated with the method used for attachment to the substrate. This inductance reduces the power distribution bandwidth and causes interactions with other power distribution elements, including other capacitors and planar capacitance. These interactions must be accounted for in optimizing the power distribution system 100. Capacitors can also be created using planar substrate structures (embedded capacitors (not shown)) for use in high frequency tuning.

Tuned planar metal structures within one or more of the substrates can be used to tune the frequency response of the power distribution system. These structures can be used to extend power system bandwidth. These structures include embedded capacitors, embedded inductors, embedded transmission lines, embedded resonators (quarter and half wave), and embedded resistors. Additional resistive elements can be added, either as embedded structures, material property controlled attach structures, or external discrete components, for the purpose of controlling the dampening properties (Q factor) of resonant structures.

Plane position can be optimized in the IC package 130, the interposer 120, or the PCB 110. Preferably, the plane position is optimized across the entire power distribution system 100. Plane size can also be optimized in the IC package 130, the interposer 120, or the PCB 110. The reduction of plane size is used to increase the parallel resonant frequency (PRF) of the power distribution system.

The planar metal structures that are used for resonance tuning/detuning can be located in the IC package 130, the interposer 120, or the PCB 110. Internal metal structures (inductors, capacitors, transmission lines, resonators) can be fabricated so as to perform electrical compensation, i.e., form equivalent lumped network parasitics and/or quarter/half wave resonant structures designed as compensating elements, and automatically track the substrate material and fabrication process. Any structure used as a compensating element that is formed from a portion of another larger structure that also contains a third structure being compensated exhibits the same electrical property changes as the third element in response to manufacturing variations, as well as the operating environment. For example, a capacitor formed from one portion of a plane that is used as a compensating element to a resonant pole formed by a larger portion of the same plane and discrete components will proportionately track the capacitance of the larger plane section.

Resistors (not shown) can be used for termination, i.e., resistive elements in any form can be used to match the impedance of a transmission structure and can be used for resonance Q factor reduction techniques. Resistors can be disposed as discrete devices on the top or the bottom of the IC package 130, the interposer 120, or the PCB 110 or can be embedded in the IC package 130, the interposer 120, or the PCB 110. Resistors can be formed as embedded substrate elements, utilizing standard embedded resistors processes. Resistors can be formed using other materials, such as controlled resistance attachment solders and epoxies. These materials can include epoxy adhesives that include a combination of conductive and/or semiconductive materials suspended in a colloid prior to curing. Exemplary materials include, but are not limited to: copper, aluminum, silver, iron, tin, nickel, gold, carbon, silicon, combinations and alloys thereof.

Figure 13:
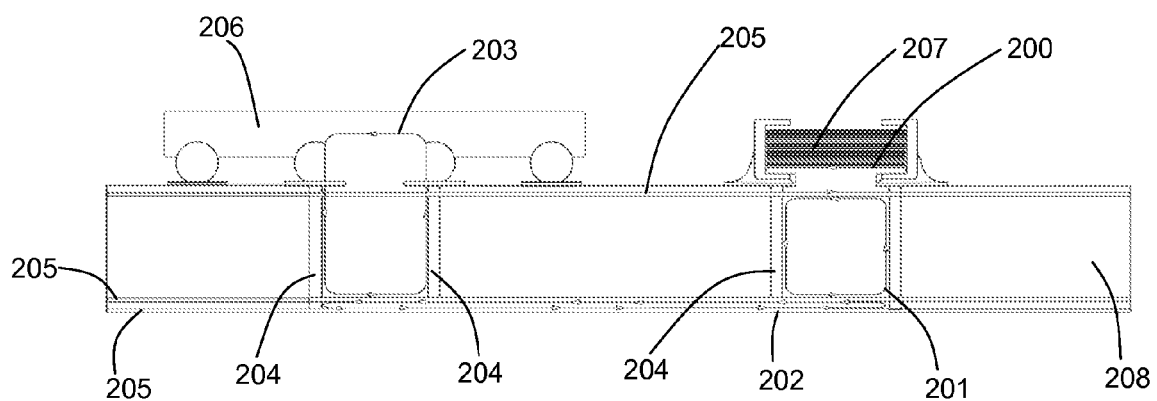
FIG. 13 illustrates various inductance loops in a PCB.

As shown in FIG. 13, inductance loops can be optimized as discussed below. The inductance through a capacitor 200 can be optimized by device selection and pad attachment design or by location of the closer power or ground plane 205 of the PCB 208 that the capacitor attaches to. The inductance through capacitor vias 201 can be optimized by the design of the vias 204, by via separation, by the location of the further power or ground plane 205, or by the use of additional vias. The inductance caused by ground and power plane spreading 202 can be optimized by the separation of plane 205 pairs or by the distance between the capacitor 207 and the IC package 206. The inductance through IC attach 203 can be optimized by the design of vias 204, by via separation, or by the use of additional vias.

Other techniques can also be used to optimize the power distribution system. The key is to obtain low impedance, including most often low inductive reactance. Not only is it important to consider the complex impedance magnitude as recognized in the prior art, but also to consider the complex impedance phase because the proper management of the phase reduces and/or completely eliminates troublesome resonances. Any technique that can manage the phase or magnitude can be used with the optimization methods discussed above.

Optimization Methods of the Power Distribution System

Optimization methods for the power distribution system include one or more of gross impedance reduction, planar inductance reduction, and delivered power inductance reduction.

Gross impedance reduction can be achieved by increasing the capacitance relative to the inductance with discrete or internal planar capacitors, decreasing the mounted capacitor inductance, and/or by optimized mounting solutions, which include through the measurement of the impedance, through the electromagnetic field simulation of the power distribution system, or through the optimized positioning of the components, and optimizing the power wiring inductance.

Planar inductance reduction can be achieved by reducing the separation between power/ground planes, (cavity height), and/or use of multiple plane sets in parallel.

Inductance between the bypass capacitors and the power wiring can be achieved by selection of the Z-axis plane location with respect to the capacitor mounting locations. Additionally, the geometry and quantity of the Z axis interconnects between the power wiring structure, typically planes, and any given capacitor and/or capacitor groups impacts the effective inductance of such an interconnect.

Similarly, inductance between the power wiring and any given IC is subject to the distance between the power wiring plane(s) and the IC die. As with the bypass capacitors, the geometry and quantity of interconnects between the power wiring structure and the die determines the total inductance.

In both cases, because it is desirable to minimize inductance materials with the lowest relative permeability, 1.0 is assumed. Non-ferrous metals such as copper, silver, and other suitable metals have relative permeabilities of about 1.0. Interconnects include PCB vias, traces, polygon fills, and other suitable interconnects.

Optimization methods for the power distribution system can include one or more of the following impedance reduction methods:

1. Pole/Zero Compensation Method;
2. Pole/Pole Compensation Method;
3. Pole/Multi-Zero Compensation Method;
4. Signal Harmonic Compensation Method; or
5. Quarter Wave Resonance Method.

1. Pole-Zero Optimization Method

Figure 1:
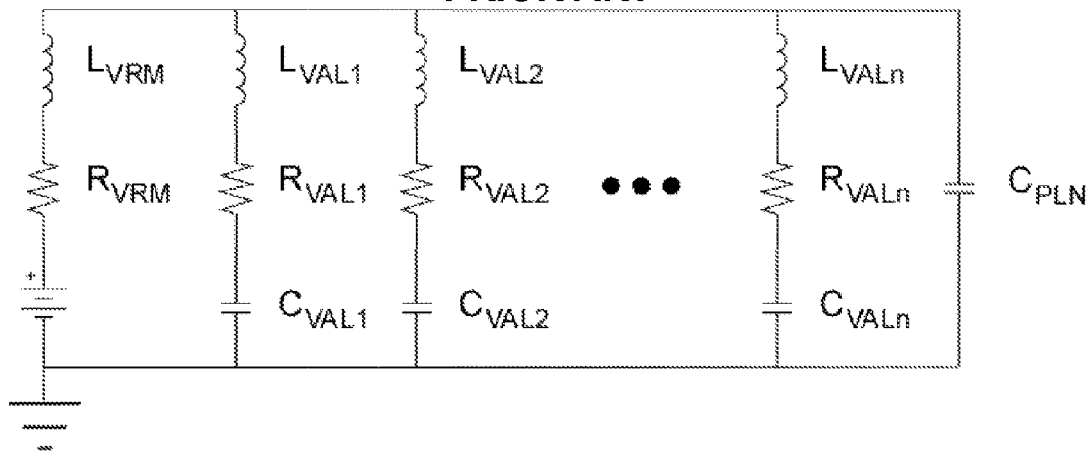
Figure 2:
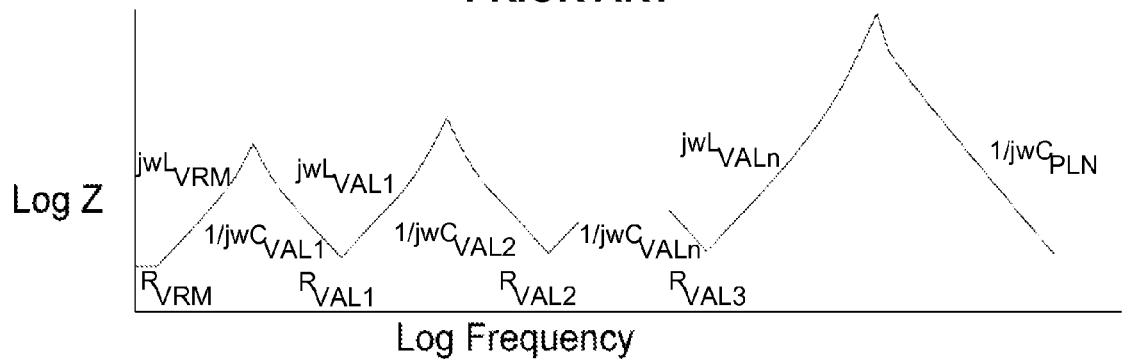
Figure 3:
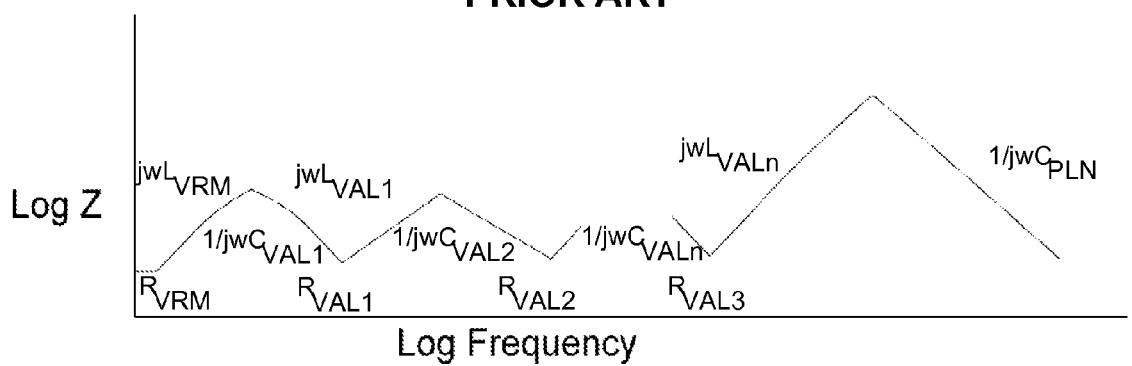
Figure 5A:
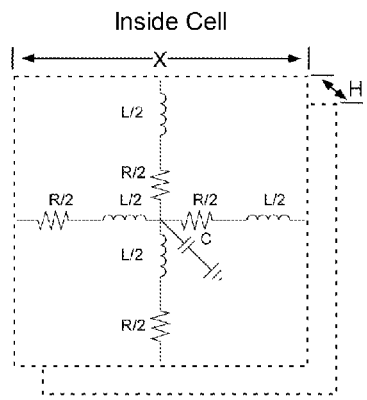
Figure 5B:
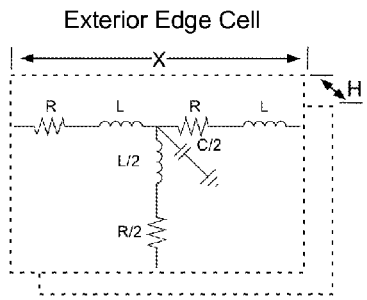
Figure 5C:
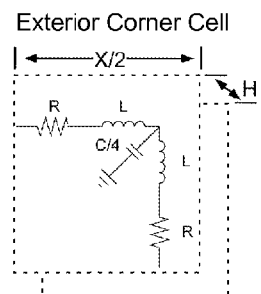
Figure 5D:
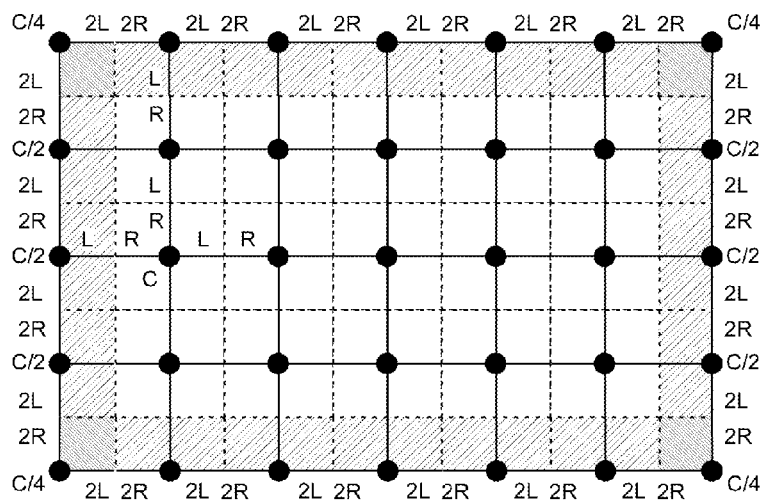
Figure 6:
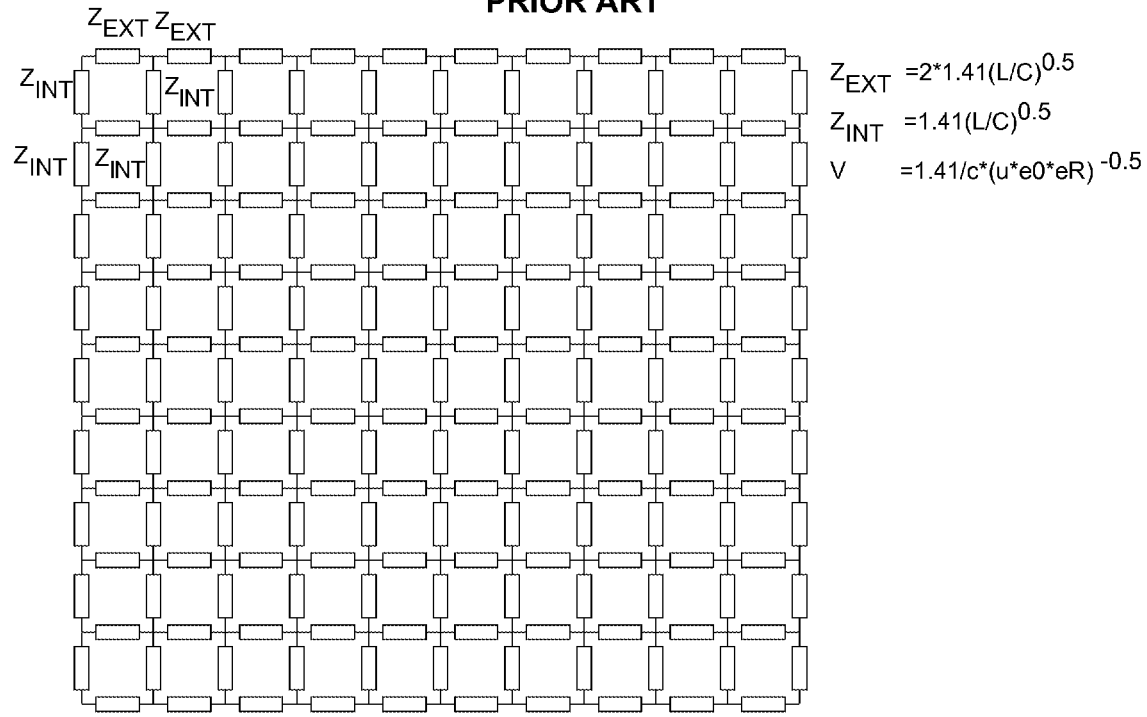
Figure 7:
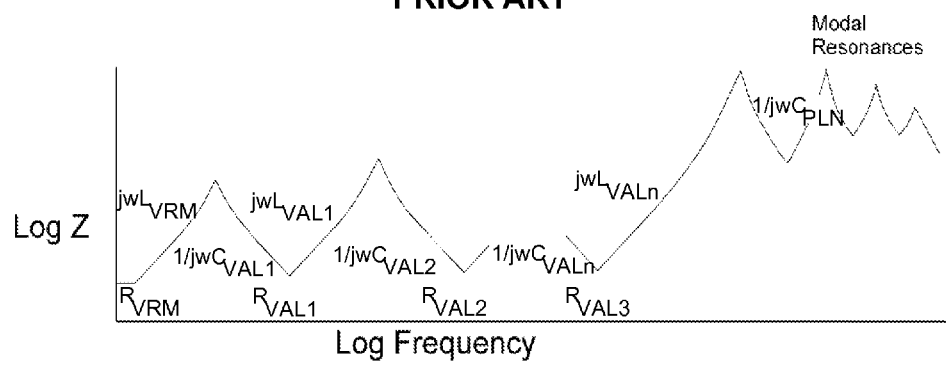
Figure 8A:
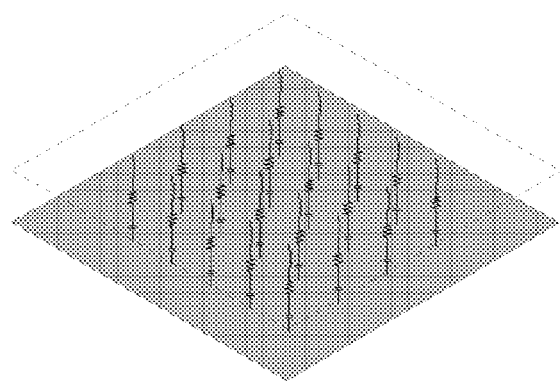
Figure 8B:
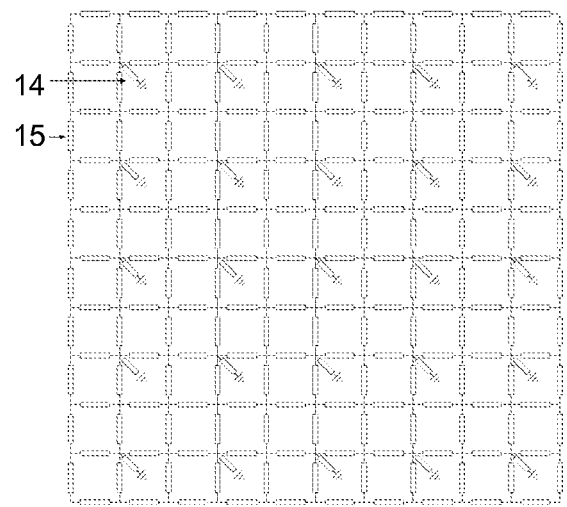
Figure 9:
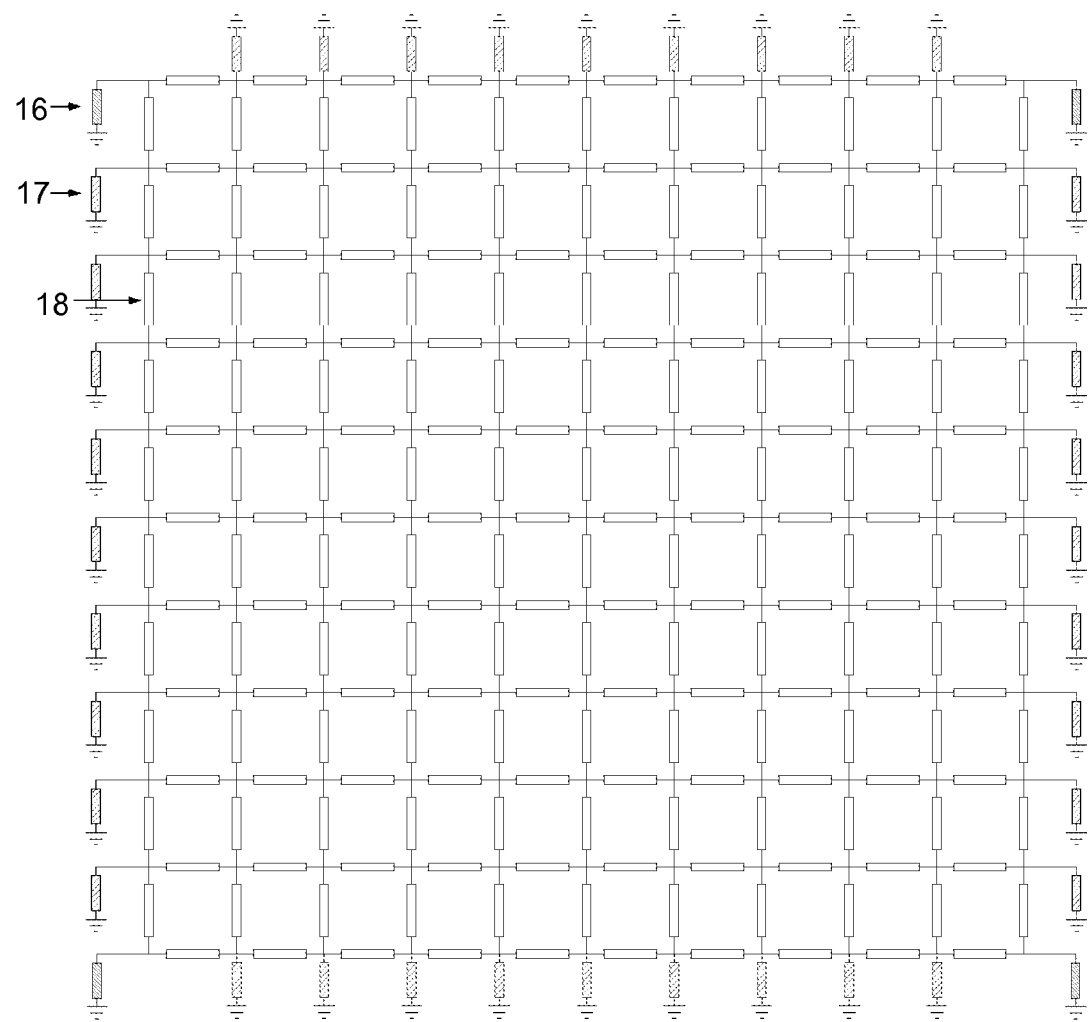
Figure 10:
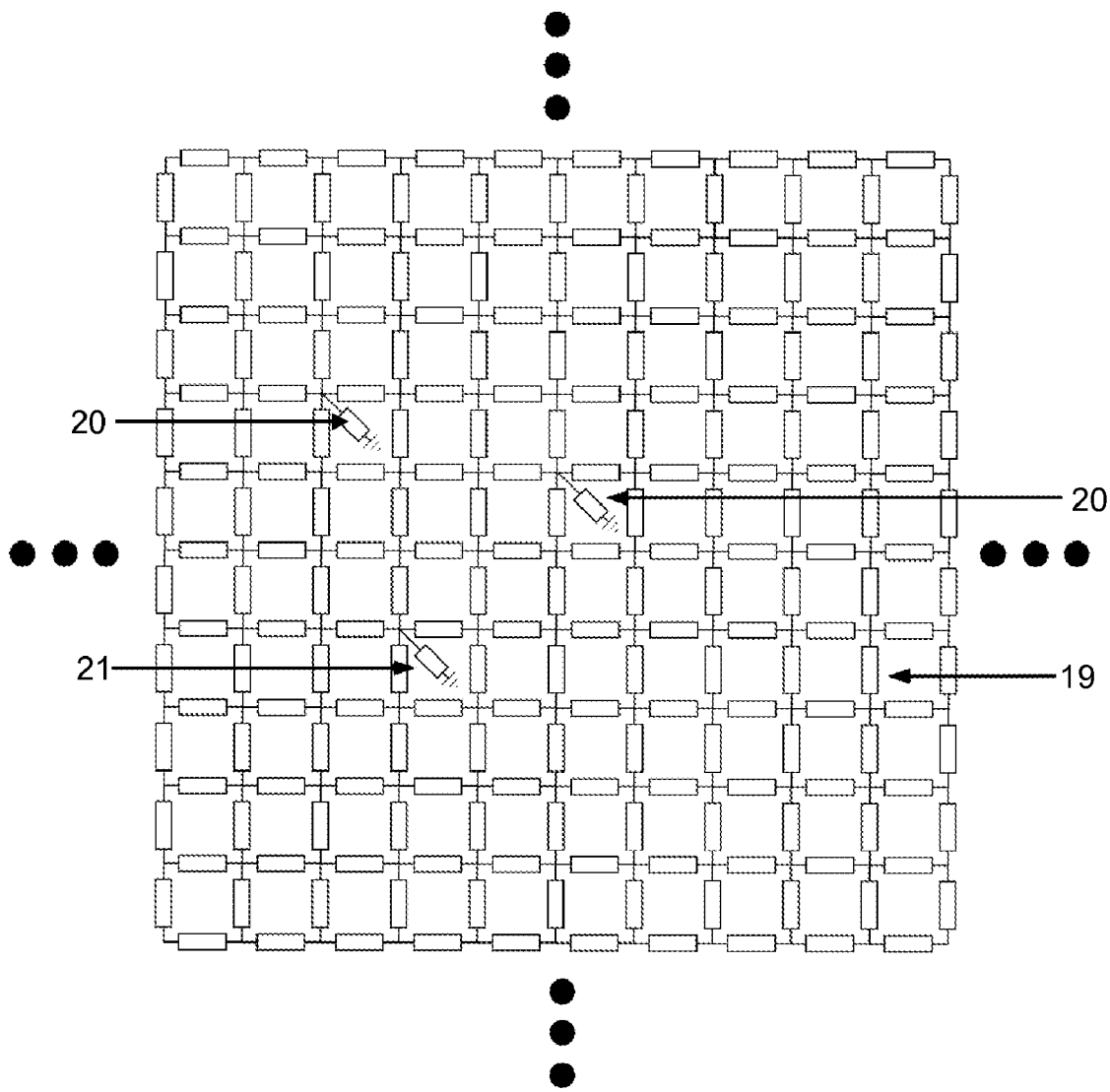
Figure 11:
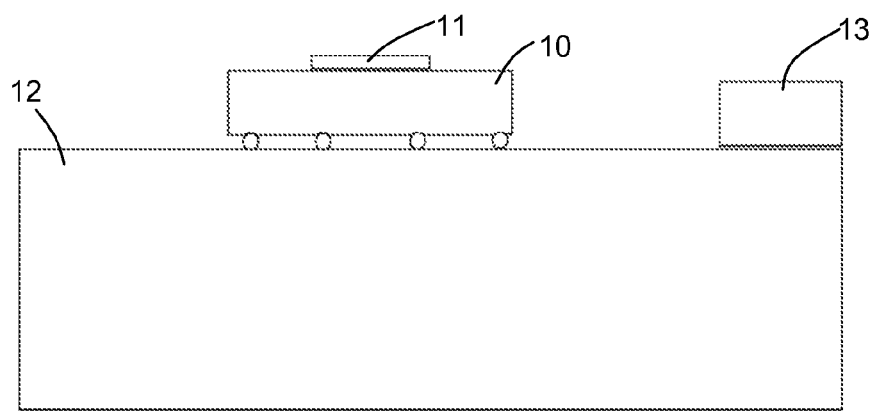

In a power distribution system with multiple pole pairs, each pole pair results from the parallel resonance between the inductance of a first network branch with the capacitance of a second network branch. A branch includes one or more elements. Typically, the first network branch consists of the equivalent transfer function of a voltage regulator module connected to the power system wiring as a first shunt branch. Additional shunt branches typically include a quantity of capacitors of a single value in each branch also connected across the power wiring network as shown, for example, in FIG. 1. Each branch N exhibits a higher self-resonant frequency than the preceding branch N-1. In the idealized case, the characteristic impedance, defined by the ratio of the mounted inductance to the capacitance, of all branches is equal. As demonstrated by Baudendistal, with sufficient resistive impedance in each branch, impedance variations of the power distribution system can be suppressed.

Each branch results in a complex admittance (the inverse of impedance) that shunts the power wiring network. Most reactive interaction occurs between branches in pairs determined by the self-resonant frequency of each branch. This can be expressed in a simplified view as the inductance of branch N-1 interacting with the capacitance of branch N, for example, branches $C_{val1}$ and $C_{val2}$ shown in FIG. 1. When the self-resonant frequencies of each branch are well separated, this approximate view affords a fairly accurate approximation. When branch SRFs are tightly spaced significant interaction occurs between more diverse branches.

Up to the first half-wave modal resonance, the power wiring networks exhibit self impedances very similar to bypass capacitors. From DC to a frequency defined by the structure geometry, the insulator effective permittivity (dielectric constant), and the location within the network, the power wiring network self-impedance decreases with increasing frequency and the phase remains close to −90°. At the defined frequency, a zero singularity occurs. The minimum impedance is reached at the zero as the phase quickly transitions from nearly −90° through 0° and to nearly +90°, where it remains up to the first half wave modal resonance associated with an impedance peak. Locations near the center of the power wiring network exhibit the highest frequency zero, while those closest to the power wiring network edges exhibit the lowest frequency zero. For a uniform square cavity, the center zero occurs at about: $F_{ZERO}=2{,}400$ MHz/(Width$_{INCHES}$*$\in_R^{0.5}$), where Width$_{INCHES}$ is the width in inches of the full side of the plane. Near the corners, the zero frequency occurs at about: $F_{ZERO}=1600$ MHz/(Inches*$\in_R^{0.5}$), where Inches is the length of a full side of the plane.

For an $\in_R$ of 4.0 and even for a large 16"×16" structure, the frequency ranges from 50 MHz near the power wiring network corners to 75 MHz near the center. This is generally higher than the self-resonant frequency of the mounted bypass capacitors. For the most common types of bypass capacitors and mounting arrangements, self-resonant frequencies rarely exceed 50-60 MHz and are most often 20 MHz or lower. As a consequence, bypass capacitor networks traditionally appear inductive over a frequency range where the self-impedance of any given point in the unloaded power wiring network still appears capacitive. The result is a parallel resonant equivalent circuit that exhibits an impedance maximum at the resonant frequency. This resonance can be suppressed by several methods, including the addition of resistance into the bypass capacitor branches as taught by Baudendistal.

This optimization method includes the suppression and the outright elimination of the resonant behavior by altering the net phase characteristics of the loaded power wiring structure. The optimal variation is a practical balance that depends substantively on the zero frequencies of the power wiring structure.

In this optimization method, the shunt network can be designed with a series of branches each with its own zero such that the self impedance of the composite network remains within 135° electrical of the power wiring network self-impedance phase at any point in the power wiring network. The shunt network can include one or more planar capacitors formed into the same or additional substrates as the power wiring network. This optimization method can include the steps of, among others:

1. Determine the maximum tolerable high frequency self impedance of the power wiring network;
2. Determine from the physical size of the power wiring network required whether the power wiring network must meet the stipulated impedance at or above the half wave mode represented by a structure with a nominal $\in_R$ for the preferred dielectric cavity material, typically 4.0;
3. Construct a surface map model of the power wiring network;
4. Map the equivalent parasitics of the mounted IC power inputs to the map constructed in step 3; and
5. Map the complex self impedance of the map constructed in steps 3 and 4 to a resolution nominally not less than one cell per 0.25".

In this optimization method, additional shunt network(s) is(are) arranged such that the phase response between the IC die and the power distribution system is controlled by a third shunt element. The third shunt network has a series resonant frequency at or near the parallel resonant frequency of the first and second components/networks, has a Q factor of about 2 or less, and has a characteristic impedance of the reactive elements that is not more than about $2.0\times\sqrt{(L_{first}/C_{second})}$, where $L_{first}$ is the inductance of the first element or network and $C_{second}$ is the capacitance of the second element or network.

When the parallel resonance between the inductance of the first network with the capacitance of the second network is not damped with a Q factor less than or equal to about 1.4, the parallel resonance so formed can cause adverse results, such as:

1. Location of a resonant peak within the power transfer bandwidth between a PCB or PCB like assembly and a component subassembly, such as a packaged IC; and
2. Location of a resonant peak within the higher signal energy spectra of an attached load, such as an IC.

The Q factor and the SRF of the third shunt network can be set by using any of the techniques discussed above. The third shunt network can be arranged to be included in the PCB 110, in the interposer 120, or the IC package 130 as shown in FIG.

Figure 14:
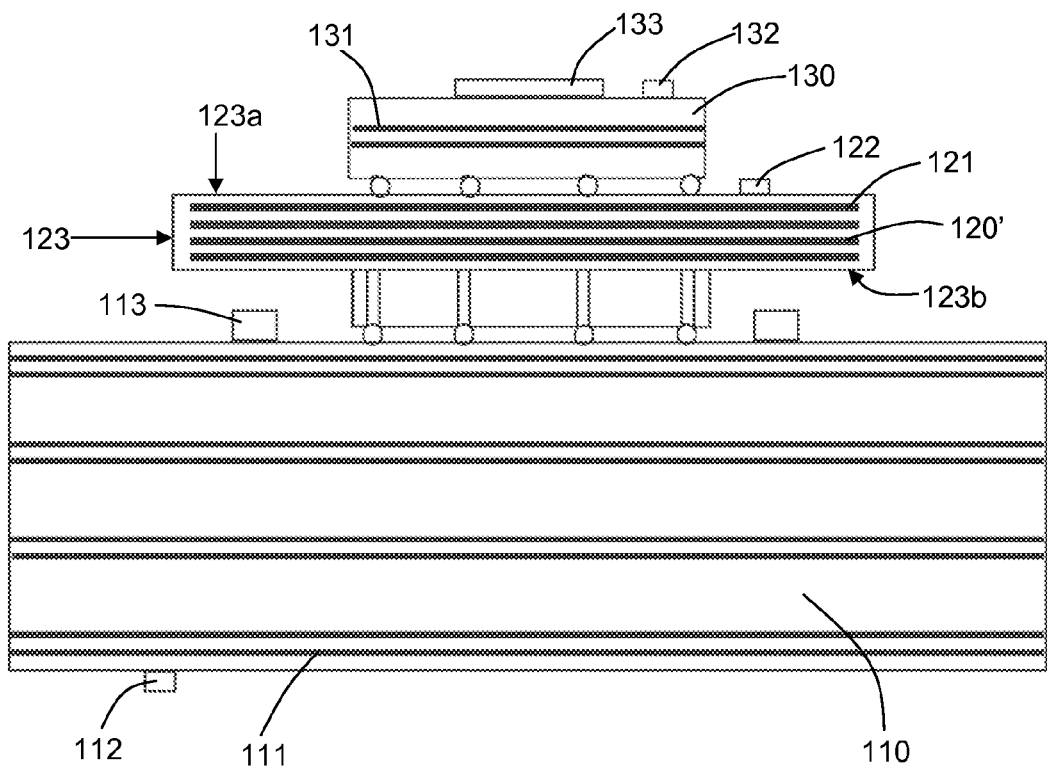
FIG. 14 illustrates an interposer according to a preferred embodiment of the present invention.

12. It is possible that the third shunt network can be arranged to be included on more than one of the PCB 110, the interposer 120, and the IC package 130. As shown in FIG. 14, the interposer 120' can include top 123a and bottom 123b tiers on wings 123, where the bottom tier 123b elevates the top tier 123a above the components 113 such that the interposer 120' can have a greater area compared to the interposer 120 of FIG. 12 without an elevating bottom tier 123b. The additional area of the top tier 123a allows for the placement of additional components, including capacitors 122, on the interposer 120'.

The benefits of using an interposer 120, 120' include one or more of the following:

1. Intended for design retrofit;
2. Connects 1:1 from PCB to IC ball grid array (BGA);
3. Provides flat, wide bandwidth power to IC;
4. Suppresses IC⇔PCB resonances;
5. Filters noise between IC and PCB;
6. Low Q power distribution very forgiving to PCB design;
7. Application PCB need only meet maximum L and maximum R specifications;
8. Riser lifts interposer structure 0.050" to clear existing SMT components on PCB; and
9. Solves power delivery issues in existing designs.

If the third shunt network is included in the PCB 110, the capacitance of the third shunt network can be set, for example, by dividing the planes embedded in the PCB 110. The divided planes of the third shunt network can form an island such that the remaining portion of the planes completely surround the divided planes of the third shunt network, or the divided planes of the third shunt network can include at least one edge of the PCB 110 such that the remaining portion of the planes of the PCB 110 do not completely surround the divided planes of the third shunt network.

The third shunt network can also include a resistive component that is formed from a planar structure formed in a PCB 110.

2. Pole-Pole Optimization Method

In this optimization method, the third shunt network is inserted in series between the first network and the second network.

The third series network, when loaded by the first network, has a parallel resonant frequency at or near the parallel resonant frequency of the first and second networks, has a Q factor of about 2 or less, and has a characteristic impedance of the reactive elements of not more than about $2.0 \times \sqrt{(L_{first}/C_{second})}$, where $L_{first}$ is the inductance of the first element or network and $C_{second}$ is the capacitance of the second element or network.

The third series network described can include a resistive component formed from a planar structure formed in a printed circuit structure. The capacitive and inductive reactances of the third series network can be formed by the combination of a discrete surface mount capacitor and printed-circuit etch features. The surface mount capacitor can be of an X2Y® design, feedthrough capacitor, or transmission line capacitor such as NEC® Proadlizer®.

3. Pole-Multi-Zero Optimization Method

A refinement of the pole-zero optimization method and the pole-pole optimization method is when the individual resonant networks are formed from groups of networks, where at least one of the networks can be composed of a plurality of capacitors where:

1. The capacitances within the at least one network can span a narrow range using multiple successive E12 series values. For example, use of 1 nF, 1.2 nF, and 1.5 nF components; and
2. Multiple mounting structures are optionally used that displace the effective mounted inductance by small amounts, typically less than 20%. The mounting structure can include variations in via diameter, via to via spacing, and geometry of via to component pad etch.

The resulting network has a greatly lowered Q factor compared with a network composed of a single discrete capacitor value, and in many cases obviates the need for a discrete resistance element in order to achieve a low Q factor response.

4. Quarter/Half Wave Resonance Optimization Method

Figure 15:
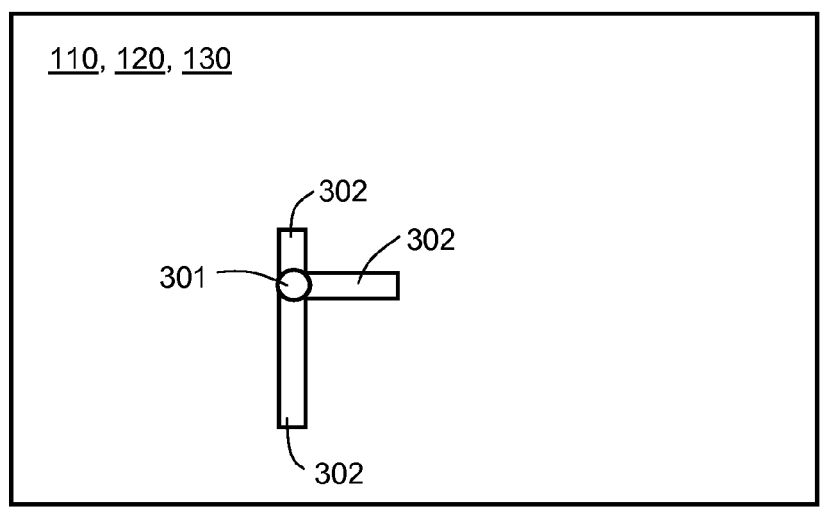
FIG. 15 illustrates half wave resonators according to a preferred embodiment of the present invention.

An additional optimization method includes providing a first series of quarter-wave resonator stubs 302 that emanate from the power distribution vias 301 of each IC as shown in FIG. 15. The vias 301 can be located in the PCB 110, the interposer 120, or the IC package 130. The frequencies of the first series of quarter-wave resonator stubs 302 are selected to correspond to the half wave resonances of the uncompensated power distribution system. The impedances of the first series of quarter-wave resonator stubs 302 are selected in linearly ascending values with frequency to minimize the negative impact of the half-wave resonance modes that result from each the first series of quarter-wave resonator stubs 302. A second series of quarter-wave resonator stubs (not shown) can also be provided to compensate the half-wave modes resulting from the first series of quarter-wave resonator stubs, resulting in an overall frequency response that has a much flatter impedance than achievable with a like planar area and layer count. The second series of quarter-wave resonator stubs can be located in the same plane as the first series of quarter-wave resonator stubs or can be located in a different plane. The second series of quarter-wave resonator stubs can be located in a different device from the first series of quarter-wave resonator stubs 302. For example, the first series of quarter-wave resonator stubs 302 can be located in the PCB 110, and the second series of quarter-wave resonator stubs can be located in the interposer 120 or 120'.

This optimization method is most applicable when the compensation structure is in IC packages or interposers. However, this optimization method can also be used when the compensation structure is in PCBs. Thin dielectrics, with or without high dielectric constant materials, can be used with this optimization method because these materials exhibit much lower inherent Q factors because of the higher ratio of the resistive skin loss to the inductance.

In many commonly used geometries, an unattainable combination of material dielectric constant and thickness is required to reach a Q factor of less than about 2 utilizing quarter wave resonators. The result is that the impedance of a plane cavity using existing materials is limited to shunt impedances in the neighborhood of $60 \times 10^{-3}$ ohms in the 1 GHz to 8 GHz region, with substantial modulation. By simply connecting two like cavities together, these impedances can be dropped to the $30 \times 10^{-3}$ Ohms range. This optimization method makes substantially better use of available physical resources and can, with two cavities, drop the total impedance to between $10\times10^{-3}$ and $20\times10^{-3}$ Ohms over this same frequency range.

5. Harmonic Suppression

Another optimization method minimizes the cost of power distribution elements by optimizing the transition frequency from the discrete PCB level bypass capacitors to either the capacitance within the IC or to the planar bypass elements (power planes), by setting the transition frequency to a value from between about 1.8 times, but no more than about 2.2 times the non-return-to-zero (NRZ) bit frequency of the highest frequency noise generating source of any substantial power.

The transition frequency is a function of the following parameters:
1. Areal density of the discrete bypass capacitors: P;
2. Mounted inductance of individual bypass capacitors: $L_{MOUNT}$;
3. Dielectric constant of planar cavity insulator material: $\in_R^* \in_0$;
4. Thickness of planar cavity insulator material: H;
5. Percentage perforation of planar cavities;
6. Spatial distribution of discrete bypass capacitors;
7. Spatial distribution of power, and power return connections to ICs connected to the power cavity; and
8. Energy storage elements, discrete, or semiconductor die within ICs connected to the power cavity.

This optimization method minimizes the integral of the product of combined IC/PCB/bypass network impedance and noise source energy. The NRZ energy exhibits a frequency spectra with a "comb" shape where the peaks decline on a linear slope from half the bit repetition rate to the highest odd multiple of half the bit repetition rate within approximately 0.5 divided by the signal rise-time, beyond which signal energy drops much more rapidly. Between the impedance peaks are substantial impedance nulls. This optimization method places a resonance within one of the nulls above the third harmonic of the highest possible data rate, typically between the third and fifth harmonics at 1.8 to 2.2 times the clock rate. This placement of the resonance guarantees that for an arbitrary data pattern, the ninth harmonic is the lowest bit rate harmonic that can align to the transition frequency. Values as low as 1.65 can be used with the impairment that the seventh harmonic of a low frequency bit pattern excites 1.75-times the maximum bit rate.

Generally, the more capacitors of a given mounted inductance that are attached to a PCB, the higher the transition frequency where the reactance of the planar plate capacitance crosses the reactance of the capacitor network mounted inductance. However, for a given capacitor mounted inductance and ESR, whenever the transition Q factor is substantially greater than 2, the addition of more capacitors fails to alter the theoretical peak impedance at the transition because, while the characteristic impedance of the composite network follows the plate capacitor impedance down, the Q factor goes up by an identical slope. One desirable characteristic of an increased Q factor is a narrower percentage bandwidth. This makes the network resonance easier to detune. An optimization technique consists of selecting a bypass capacitor areal density such that the resulting resonance between the bypass capacitor network combined with the shunt impedance of any other devices, such as ICs, occurs at a frequency that can be practically damped with the use of one of the aforementioned compensation techniques.

The above described optimization methods can be used for a single IC on a PCB or multiple ICs on a PCB. The optimization methods can be used separately or in combination with one another. Typically, the pole-zero optimization method will be used, either separately or in combination with the other optimization methods.

Interposer

An interposer 120, 120' that can include discrete bypass capacitors 122 can be placed between an IC package 130 and an application PCB 110. The interposer 120, 120' may preferably include a series of metallic layer planes 121, e.g., copper, laminated between organic dielectric materials. An IC package 130 can be mounted to the top of the interposer 120, 120' in a normal solder reflow or adhesive cure process. Any other suitable method can also be used to mount the IC package 130. However, the interposer 120, 120' outline is substantially larger than the attached IC package 130 to allow for attachment of discrete bypass capacitors 122 and other discrete components as required by the application. The interposer 120, 120' can include one or more power supply functions implemented with linear or switch mode methods.

The interposer 120, 120' typically attaches to the application PCB 110 using normal solder reflow or conductive adhesive cure process. Other suitable methods of attaching the interposer 120, 120' can also be used.

The interposer power distribution cavities are typically each composed of thin, less than or equal to about 35 μm or about 1 mil, dielectric cavities. The thickness and the dielectric constant of each cavity is selected according to the needs of the IC package 130 for which the interposer 120, 120' is designed. Discrete bypass capacitors 122 are typically attached to the upper surface of the interposer 120, 120' (IC package 130 mounting side), but can also attach to the bottom surface of the interposer 120, 120'. The power distribution for a single power rail can consist of (1) a cavity over substantially the entire extent of the interposer 120, 120', (2) multiple such cavities, or (3) a subsection of such a cavity, as determined by the power requirements of the die 133 and the IC package 130 that the interposer 120, 120' is designed to interface.

The interposer 120, 120' can include the use of resistive elements in any and/or all forms, including discrete surface mount components, planar resistors such as Ohmega, and/or vertical contact resistors formed from a cured epoxy/carbon and/or copper or silver matrix.

Resistive elements can occur in any combination of (1) in series between the power cavity(s) and the application PCB attachment on the interposer bottom side, (2) in series with the discrete bypass capacitors 122 mounted on the interposer 120, 120', (3) in series with the cavity subsections on the interposer 120, 120', and (4) in series between the interposer power cavity(s) and the IC package 130.

The interposer 120, 120' can include one or more pole-zero cancellation networks to suppress the resonance between the discrete bypass capacitors 122 and the power cavity(s) in the interposer 120, 120'. The interposer 120, 120' can include one or more pole-zero cancellation networks to reject the propagation of energy that occurs at or near resonances within the attached IC package 130 to and from the application PCB 110.

The interposer 120, 120' can include one or more pole-zero cancellation networks to suppress the resonance between the attached IC package 130 and the interposer power cavity(s) and the discrete bypass capacitors 122.

The interposer 120, 120' can include one or more pole-pole cancellation networks to suppress the resonance between the discrete bypass capacitors 122 and the power cavity(s) in the interposer 120, 120'.

The interposer 120, 120' can include one or more pole-pole cancellation networks to suppress the resonance between the interposer 120, 120' and the attached IC package 130.

The interposer 120, 120' can be constructed such that the resonance on a given voltage rail between the discrete bypass capacitors 122 and the interposer power cavity(s) lies from about 1.8 times to about 2.2 times the clock frequency of the highest I/O frequency on a given power rail of the attached IC package 130.

The interposer 120, 120' can be constructed such that the resonance on a given voltage rail between the composite interposer 120, 120' and attached IC package 130 lies from about 1.8 times to about 2.2 times the clock frequency of the highest I/O frequency on a given power rail of the attached IC package 130.

The interposer 120, 120' can include one or more quarter wave resonating structures, as shown in FIG. 15, to suppress the modal resonances of any given power cavity(s) in the interposer 120, 120'.

The interposer 120, 120' can include one or more low pass filter structures to limit the high frequency content of the IC I/O signals.

The interposer 120, 120' can include one or more transient suppression devices to provide protection to one or more IC pins.

The interposer 120, 120' can include one or more linear or switching power supply circuits to regulate power to the IC package 130. The interposer 120, 120' can include a power cavity close to the top surface of the interposer 120, 120' and matching power cavity near the bottom of the interposer 120, 120' connected through a plurality of vertical interconnects, typically vias, so as to minimize the inductance between the bypass components attached to either side of the interposer 120, 120' and both the attached IC package 130 and PCB 110. The benefit of such an arrangement is reduced power supply impedance presented to both the IC die 133 of the IC package 130 and the application PCB 110. This reduced impedance in both directions serves to substantively reduce transmission path discontinuities that occur when a planar signal line in the PCB 110 references one or the other voltage nodes of the respective I/O power rail, while the vertical interconnects from the PCB 110 through the interposer 120, 120' and the IC package 130 references either the other respective voltage node or a combination of the two voltage nodes of the respective I/O voltage rail. This improves both I/O signal fidelity, and reduces the noise, including EMI that would otherwise propagate through the application PCB I/O power cavity(s).

Figure 21C:
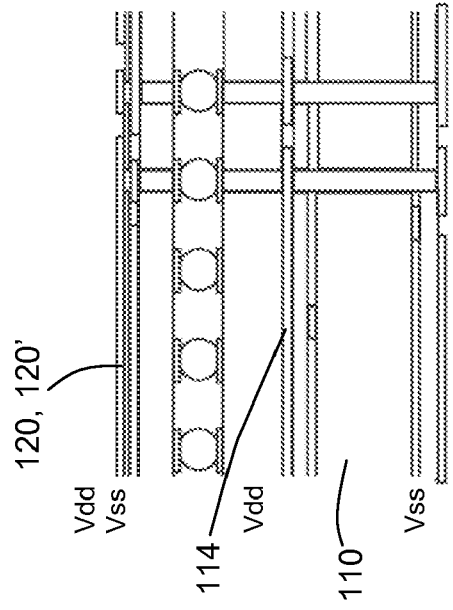
FIGS. 21A and 21B are circuit diagrams of an arrangement of an interposer according to a preferred embodiment of the present invention illustrated, respectively, in FIGS. 21C and 21D.
Figure 21D:
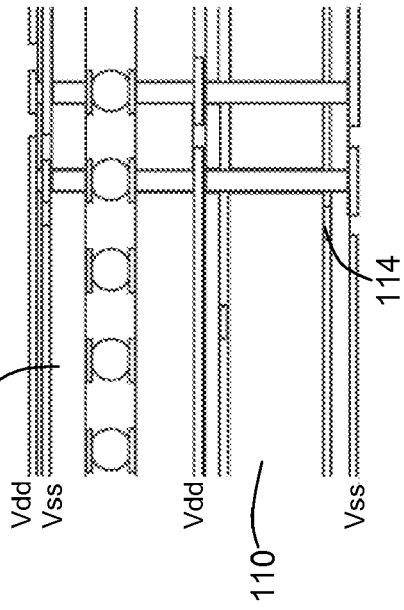
Figure 21A:
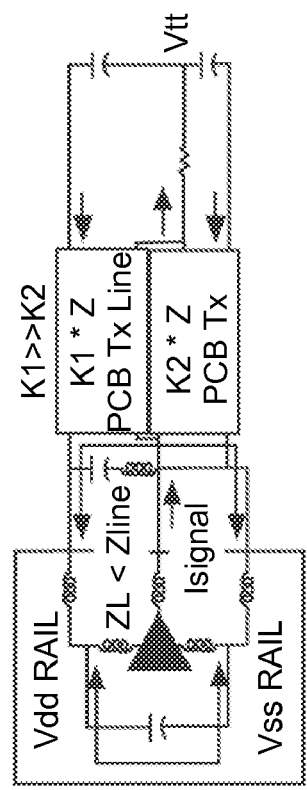
Figure 21B:
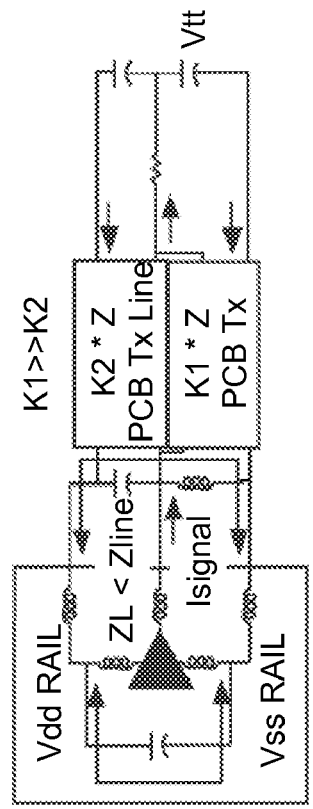

By way of the tight rail to rail coupling afforded by the thin dielectric layers of the interposer 120, 120', the interposer 120, 120' improves the return path into the IC package 130 (not shown in FIG. 21C or 21D) regardless of the I/O voltage plane, $v_{dd}$ or $v_{ss}$, referenced by the application signal in the signal trace 114 on the PCB 110, as shown in FIGS. 21A and 21C and in FIGS. 21B and 21D. This permits possible reduction of the number of plane layers required in the application PCB 110 and permits possible improvement in signal performance that cannot be matched by any known PCB construction.

The interposer 120, 120' can remap the connections from the IC package 130 to the application PCB 110 to any or any combination of purposes:
  Reduce crosstalk between I/O signals by more optimal arrangement than the original IC; and
  Simplify power interconnect on the application PCB.

The interposer 120, 120' can include attachment interconnects to the application PCB 110 outside the perimeter of the IC package 130. These interconnects can be used for any combination of purposes:
  Reduce the number of application PCB layers needed to "break-out" the signal connections from the composite interposer 120, 120'/IC package 130 to the PCB 110 versus the original IC connection pattern;
  Reduce crosstalk between I/O signals by more optimal arrangement than the original IC package; and
  Simplify power interconnect on the application PCB 110.

Figure 16:
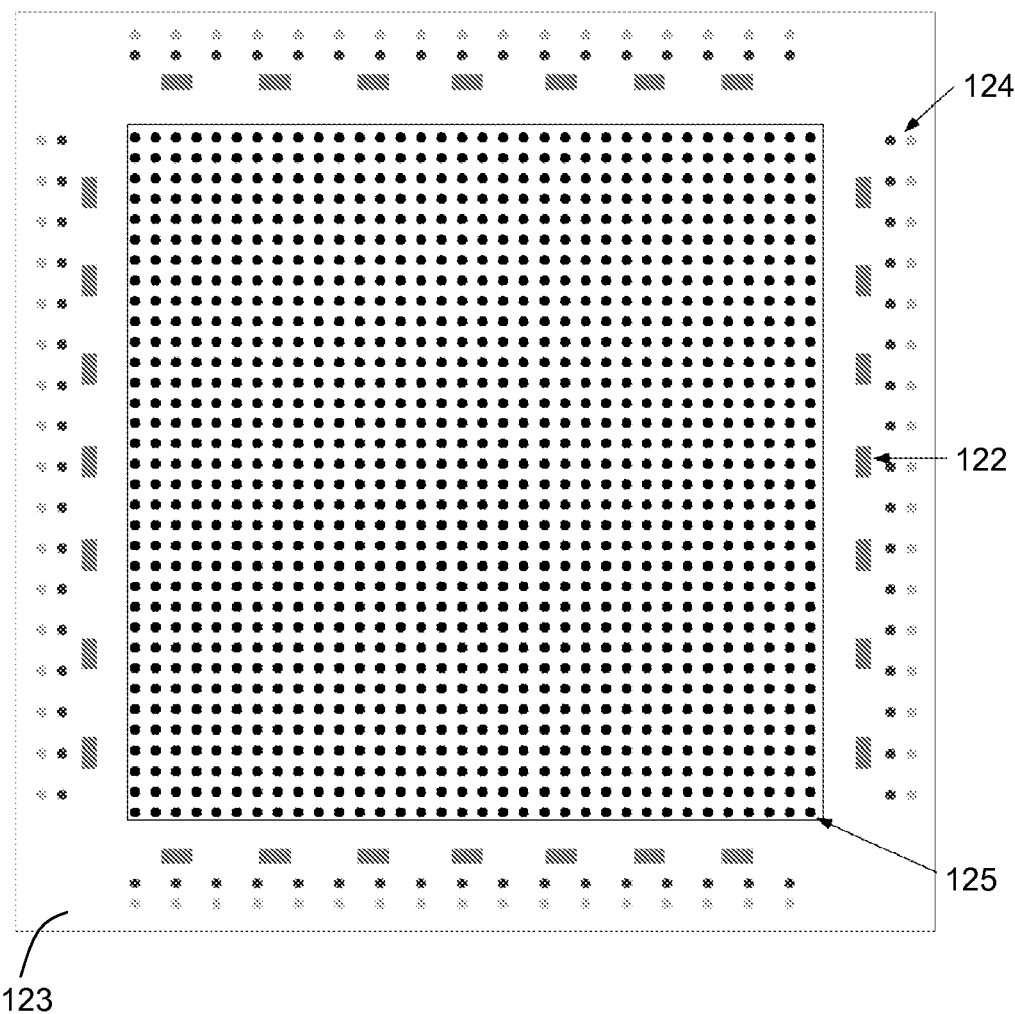
FIG. 16 illustrates an interposer according to a preferred embodiment of the present invention.
Figure 17A:
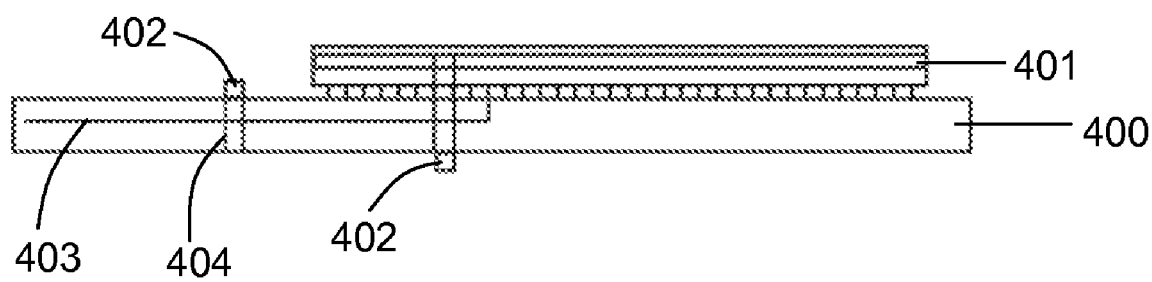
FIG. 17A illustrates a known power distribution system.
Figure 17B:
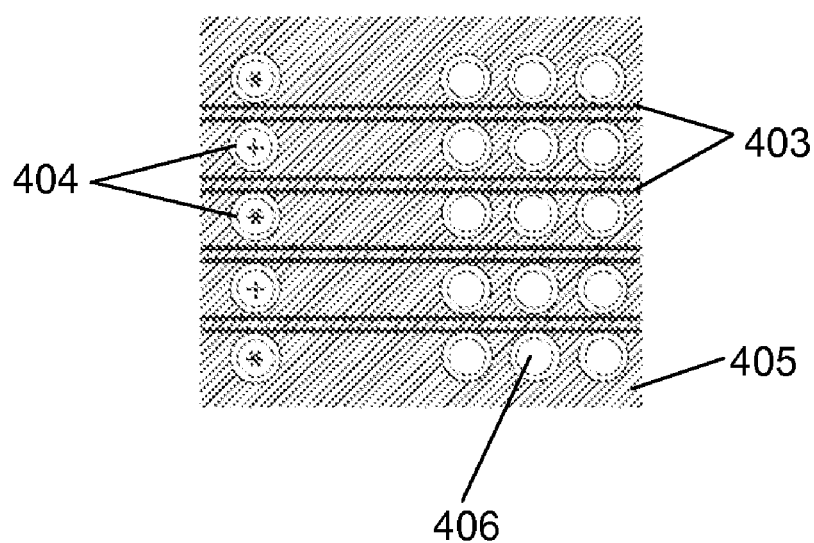
FIG. 17B is a close-up sectional view of signal traces of the known power distribution system illustrated in FIG. 17A.
Figure 18A:
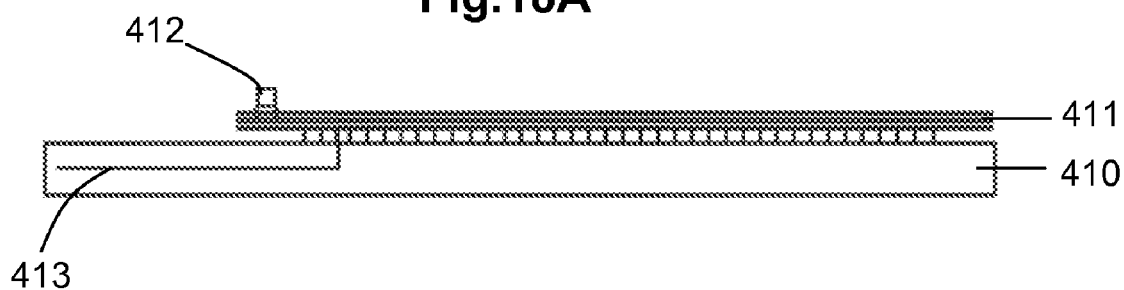
FIG. 18A illustrates a power distribution system according to a preferred embodiment of the present invention.
Figure 18B:
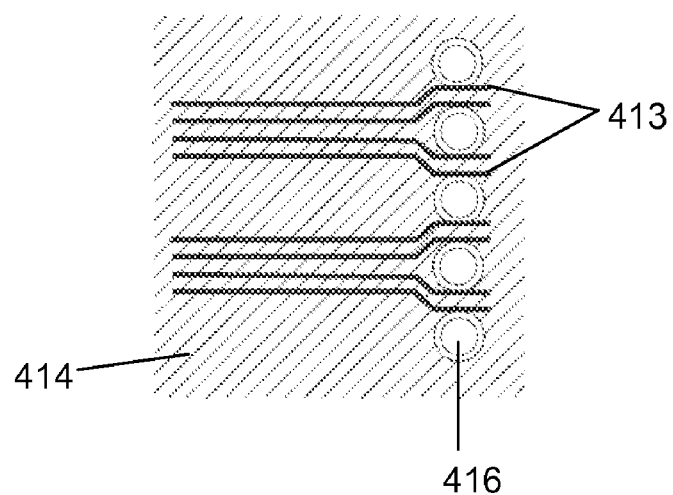
FIG. 18B is a close-up sectional view of signal traces of the known power distribution system according to a preferred embodiment of the present invention illustrated in FIG. 18A.

As shown in FIG. 16, the interposer 120' can include wings 123, which extend beyond the portion of the interposer 120' having an array of IC package interconnects connected to the IC package 130, that provide locations for the bypass capacitors 122. The interposer 120' can include one or more wings. Because the bypass capacitors 122 are located on the wings 123, neither the bypass capacitors 122 nor their respective vertical interconnects compete with the vertical IC package interconnects between the substrate of the interposer 120' and the PCB 110 (not shown in FIG. 16) or the horizontal interconnects between the vertical IC package interconnects and the IC package 130 or IC die 133 (neither shown in FIG. 16). Location of the bypass capacitors 122 on the wings 123 also facilitates thermal isolation between the bypass capacitors 122 and the IC die 133 heat removal infrastructure. Optionally, the wings 123 are formed to include a limited number of power and power return vertical interconnects 124 to join the substrate of the interposer 120' with the PCB 110. As a result, the following benefits are realized:
  1. On the higher level assembly (typically the application PCB 110), bypass capacitors 122, and their associated vertical interconnect are not required to be close to the substrate. Instead, the low density power interconnects 124 are readily traversed by signal traces 114 while maintaining generous overlap of signal traces 114 by the associated reflection plane. This is seen by comparing FIGS. 17 and 18. Prior Art FIG. 17 shows a conventional IC package 401 connected to a PCB 400. Bypass capacitors 402 are attached to both surfaces of the PCB 400. The bypass capacitor interconnects 404 perforate the PCB 400. Signal traces 403 on reflection plane 405 must be routed around both the bypass capacitor interconnects 404 and the signal interconnects 406. FIG. 18 shows a subassembly 411, which can be an interposer or an IC package according to one of the preferred embodiments of the present invention, connected to a PCB 410. Bypass capacitors 412 are attached to subassembly 411. The bypass capacitor interconnects do not perforate the PCB 410 because they are located on the subassembly 411. Signal traces 413 that reference reflection plane 414 must be routed around only the signal interconnects 416.
  2. On the interposer 120', the bypass capacitors 122 join to voltage nodes through planar interconnects. Vertical signal interconnect 125 does not substantively compete with the bypass capacitor locations or interconnects.
  3. By virtue of the thin interconnect structures between the bypass capacitors 122 and the IC package 130/die 133 and of the uninterrupted planar region on which the capacitors are mounted, the IC package 130/die 133 to bypass capacitor 122 inductance is minimized. Use of a thin dielectric within the limited extents of the package reduces cost compared to use on the entire higher level assembly, typically PCB 110.

4. By virtue of the uninterrupted planar region on which the bypass capacitors 122 are mounted, bypass capacitor 122 to bypass capacitor 122 inductance can be minimized, thus reducing the Q factor and the effects of parallel resonance between the bypass capacitors 122 of different values.

Figure 19A:
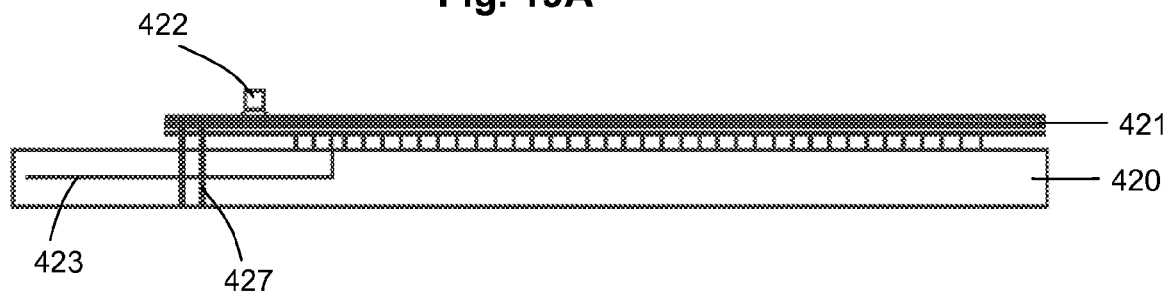
FIG. 19A illustrates a power distribution system according to a preferred embodiment of the present invention.
Figure 19B:
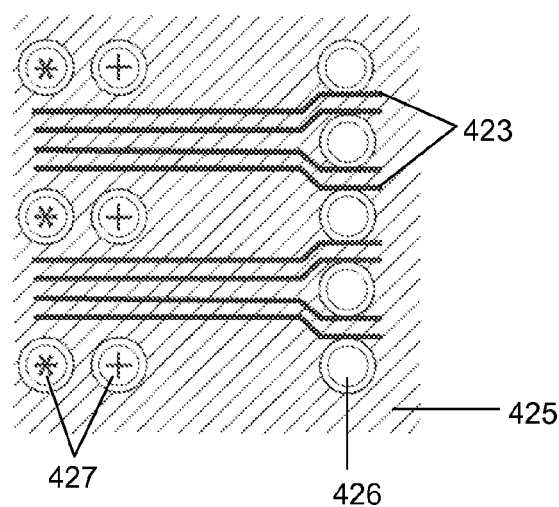
FIG. 19B is a close-up sectional view of signal traces of the known power distribution system according to a preferred embodiment of the present invention illustrated in FIG. 19A.

5. When additional limited vertical power interconnects are used between the substrate of the interposer 120, 120' and the PCB 110, the lower density of the interconnects is much less restrictive to signal routing than a fully populated interconnect grid. As such, more signal traces 114 per planar routing layer can be used in the PCB 110, as seen in FIG. 19. FIG. 19 shows a subassembly 421, which can be an interposer or an IC package according to one of the preferred embodiments of the present invention, connected to a PCB 420. Bypass capacitors 422 are attached to subassembly 421. The bypass capacitor interconnects do not perforate the PCB 420 because they are located on the subassembly 421. Because the power interconnects 427 are located at the periphery of the subassembly 421, the power interconnects 427 can be made less dense. Signal traces 423 on reflection plane 425 must be routed around both the power interconnects 427 and the signal interconnects 426. However, because the power interconnects 427 are less dense, the routing of the signal traces 423 is easier.

For example, in a typical known package under common manufacturing rules, vertical interconnects consist of 10 mil drill holes, with 20 mil diameter capture pads and 28 mil clearance diameters (anti-pads) on unconnected layers. A fully populated signal grid utilizing 39.4 mil (1 mm) spacing nets 39.4 mil minus 28 mils=11.4 mils between anti-pad tangents. Typically, only one signal on a 4 mil trace with 4 mil space (typically 50 Ohm over 4 mil dielectric) can fit within the 11.4 mils. A second trace would require at a minimum: 4 mil trace, 4 mil space, second 4 mil trace, for 12 mils total, slightly violating the anti-pads, and risking an electrical short. Further, the anti-pad raises the trace impedance.

The wings 123 of the interposer 120' can be populated at a lower density, such as about 78.7 mil (2 mm) pitch. Under the same manufacturing rules stated above, the available routing area is about 78.7 mils minus about 28 mils=about 50.7 mils. Within the about 50.7 mils, six traces can be routed, equivalent to three traces for each of the two columns. Additionally all six traces run over solid plane and so do not suffer significant impedance modulation as a result of traversing the additional vertical power interconnect.

6. When additional vertical power interconnects are used at the periphery of the interposer 120, 120', the larger effective working radius of the interconnect substantially improves the inductance of the vertical interconnect between the interposer 120, 120' and the PCB 110 reduces the inductance between the interposer 120, 120' and the PCB 110 improving the noise filtering performance of the capacitors 122 included on the interposer 120, 120' with respect to the PCB 110.

7. When vertical power interconnects are restricted to the periphery of the IC package 130 as seen in comparing FIGS. 20A and 20B, the small inductance of the in-package power cavities can be manipulated to enhance high frequency noise rejection between the IC package 130/die 133 and the PCB 110.

Figure 20A:
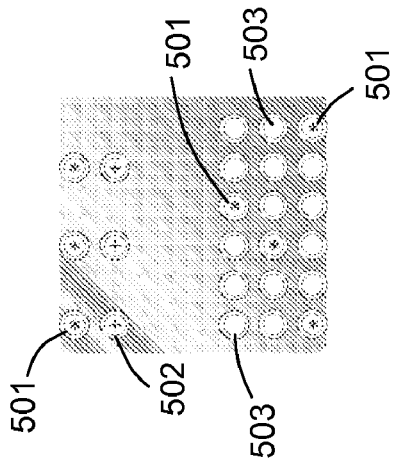
FIG. 20A illustrates a known possible arrangement of z-axis interconnects.

FIG. 20A shows an array of interconnects that include $v_{ss}$ 501 and $v_{dd}$ 502 power interconnects and signal interconnects 503. The distance between the $v_{ss}$ power interconnect 501 and the $v_{dd}$ power interconnect 502 is approximately 1.4 times the pitch between adjacent interconnects. Signal interconnects couple 70% with the closest $v_{dd}$ 502/$v_{ss}$ 501 power interconnect and 30% with the closest $v_{ss}$ 501/$v_{dd}$ 502 power interconnect. As a result of this arrangement of interconnects and as shown in the circuit diagram of FIG. 20B, 70% or 30% of the energy remains referenced to $v_{ss}$ along path A and 30% or 70% of the energy is diverted through the power network wiring.

Figure 20C:
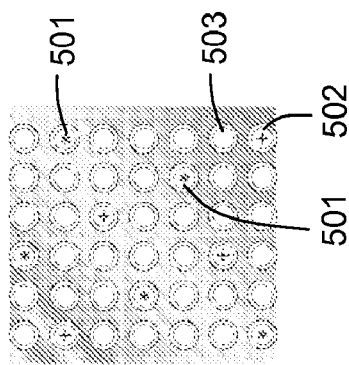
FIG. 20C illustrates possible z-axis interconnects according to a preferred embodiment of the present invention.
Figure 20B:
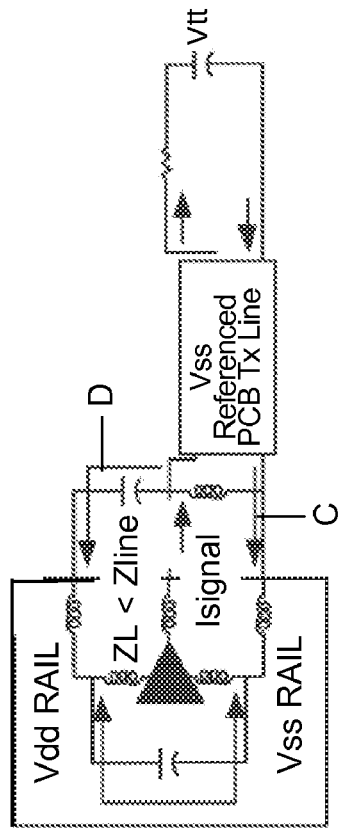
FIG. 20B illustrates a circuit diagram of the arrangement illustrated in FIG. 20A.
Figure 20D:
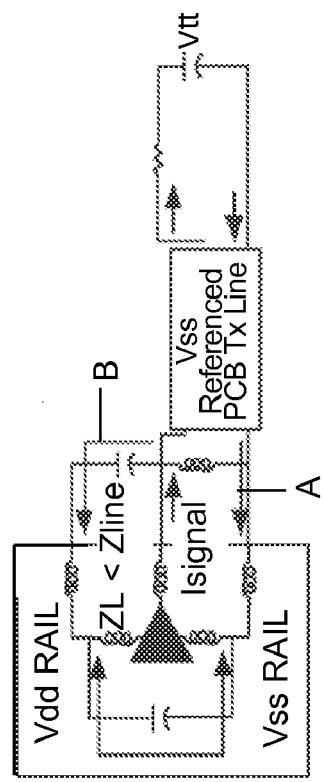
FIG. 20D illustrates a circuit diagram of the arrangement illustrated in FIG. 20C according to a preferred embodiment of the present invention.

FIG. 20C also shows an array of interconnects that include $v_{ss}$ 501 and $v_{dd}$ 502 power interconnects and signal interconnects 503. However, the signal interconnects 503 are arranged in array with a plurality of $v_{ss}$ power interconnects 502 interspersed in the array of signal interconnects 503, and the $v_{ss}$ 501 and $v_{dd}$ 502 power interconnects are arranged outside of the array of signal interconnects 503. The distance between adjacent $v_{ss}$ power interconnects 501 and $v_{dd}$ power interconnects arranged outside of the array of signal interconnects 503 is approximately the pitch between adjacent interconnects. Signal interconnects 503 couple 70% with the closest $v_{ss}$ power interconnect 501 and 30% with the next closest $v_{ss}$ power interconnect 501. As a result of this arrangement of interconnects and as shown in the circuit diagram of FIG. 20D, virtually 100% of the energy remains referenced to $v_{ss}$ along path C and 0% of the energy is diverted through the power network wiring.

8. When the vertical power interconnects are restricted to the periphery of the IC package 130 as seen in comparing FIGS. 20A and 20B with FIGS. 20C and 20D, all vertical signal returns can reference a single reflection reference, typically signal common. Under these conditions, the impedance, allowable inductance, and therefore number of power interconnects between the interposer 120, 120' and the PCB 110 is determined by power delivery and not signal cross-talk/power bounce requirements.

IC Package

As shown in FIGS. 12 and 14, an IC package 130 can include discrete bypass capacitors 132 placed on the periphery of a packaged integrated circuit, where the IC package 130 has been extended beyond the boundaries normally required by its signal and power delivery pins. The IC package 130 is typically composed of a series of metallic planes 131, e.g. copper, laminated between organic dielectric materials, as part of a standard IC package process. An IC die 133 can be mounted to the top of the IC package 130 in a normal solder reflow or adhesive cure process. The IC die 133 can be mounted to the IC package 130 by any suitable method. The IC package 130 outline is substantially larger than what would normally be required by the IC die 133 to allow for attachment of additional bypass capacitors 132 and other discrete components (not shown) as required by the application. The IC package 130 can include one or more switch mode power supply functions.

The IC package 130 can attach to an interposer 120, 120' as shown in FIGS. 12 and 14 or can be directly attached to the application PCB 110 using any suitable method, including using normal solder reflow, conductive adhesive cure process, pins, or land grid array structures, sockets, or other interposing structures.

The IC package power distribution cavities are typically each composed of thin, less than or equal to about 35 μm or about 1 mil, dielectric cavities. The thickness and the dielectric constant of each cavity is selected according to the needs of the IC for which the IC package 130 is designed. Bypass capacitors 132 can be attached to the upper surface of the IC package 130 or can be embedded within the IC package 130. The power distribution for a single power rail can include (1) a cavity over substantially the entire extent of the IC package, (2) multiple such cavities, or (3) a subsection of such a cavity, as determined by the power requirements of the IC die 133 and the IC package 130.

The IC package 130 can include the use of resistive elements in any and/or all forms, including discrete surface mount components, planar resistors such as Ohmega, and/or vertical contact resistors formed from a cured epoxy/carbon and/or copper or silver matrix.

Resistive elements can occur in any combination of (1) in series between the power cavity(s) and the application PCB 110, (2) in series with the discrete bypass capacitors 132 mounted on the IC package 130, (3) in series with the cavity subsections on the IC package 130, and (4) in series between the package power cavity(s) and the IC package 130.

The IC package 130 can include one or more pole-zero cancellation networks to suppress the resonance between the discrete capacitors and the power cavity(s) in the IC package 130. The IC package 130 can include one or more pole-zero cancellation networks to reject the propagation of energy that occurs at or near resonances to and from the application PCB 110.

The IC package 130 can include one or more pole-zero cancellation networks to suppress the resonance between the attached die 133 and the IC package power cavity(s) and the bypass capacitors 132.

The IC package 130 can include one or more pole-pole cancellation networks to suppress the resonance between the discrete bypass capacitors 132 and the power cavity(s) in the IC package 130.

The IC package 130 can include one or more pole-pole cancellation networks to suppress the resonance between the IC package 130 and the attached IC die 133.

The IC package 130 can be constructed such that the resonance on a given voltage rail between the discrete bypass capacitors 132 and the package power cavity(s) lies from about 1.8 times to about 2.2 times the clock frequency of the highest I/O frequency on a given power rail of the attached IC die 133.

The IC package 130 can be constructed such that the resonance on a given voltage rail between the composite IC package 130 and the attached IC die 133 lies from about 1.8 times to about 2.2 times the clock frequency of the highest I/O frequency on a given power rail of the attached IC package 130.

The IC package 130 can include one or more quarter wave resonating structures to suppress the modal resonances of any given power cavity(s) in the IC package 130.

The IC package 130 can include one or more low pass filter structures to limit the high frequency content of the IC I/O signals passing to and from the power wiring of the application PCB 110.

The IC package 130 can include one or more transient suppression devices to provide protection to one or more IC pins.

The IC package 130 can include one or more linear or switching power supply circuits to regulate power to the IC package 130. The IC package 130 can include a power cavity close to the top surface of the IC package 130 and a matching power cavity near the bottom of the IC package 130 connected through a plurality of vertical interconnects, typically vias, to minimize the inductance between the bypass components attached to the IC package 130 and the PCB 110. The benefit of such an arrangement is reduced power supply impedance presented to both the IC die 133 and the application PCB 110. This reduced impedance in both directions serves to substantively reduce transmission path discontinuities that occur when a planar signal line in the PCB 110 references one or the other voltage nodes of the respective I/O power rail, while the vertical interconnects from the PCB 110 through the IC package 130 references either the other respective voltage node or a combination of the two voltage nodes of the respective I/O voltage rail. In turn, this improves both I/O signal fidelity, and reduces the noise, including EMI that would otherwise propagate through the application PCB I/O power cavity(s).

By way of the tight rail to rail coupling afforded by the thin dielectric layers, the IC package 130 improves the return path into the IC die 133 regardless of the I/O voltage plane referenced by the application signal. This permits possible reduction of the number of plane layers required in the application PCB 110.

The IC package 130 can remap the usual connections from the IC die 133 to the application PCB 110 to any or any combination of purposes:

Reduce crosstalk between I/O signals by more optimal arrangement than the known IC die; and Simplify power interconnect on the application PCB 110.

The IC package 130 can include attachment interconnects to the application PCB 110 outside the known perimeter of the IC package. These interconnects can be used for any combination of purposes:

Reduce the number of application PCB layers needed to "break-out" the signal connections from the IC package 130 to the PCB 110 versus the known IC package connection pattern;

Reduce crosstalk between I/O signals by more optimal arrangement than the known IC package; and Simplify power interconnect on the application PCB 110.

Applicants hereby incorporate by reference the subject matter disclosed in U.S. Patent Application Nos. 60/804,089; 60/887,148; and 60/887,149.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A method for supplying power to an integrated circuit comprising:
    providing the integrated circuit;
    providing a power wiring network supplying power to the integrated circuit, the power wiring network having a first component having an inductance $L_{first}$ and having a second component having a capacitance $C_{second}$; and
    providing a shunt network that has a series resonant frequency at or near a parallel resonant frequency of the first and second components.

2. A method according to claim 1, wherein the shunt network has a Q factor of about 2 or less.

3. A method according to claim 1, wherein the shunt network has a Q factor of about 1.4 or less.

4. A method according to claim 1, wherein reactive elements of the shunt network have a characteristic impedance not more than about $2.0 \times \sqrt{(L_{first}/C_{second})}$.

5. A method according to claim 1, further comprising suppressing or eliminating resonant behavior of the power wiring network by altering a net phase characteristic of the power wiring network.

6. A method according to claim 1, wherein the shunt network is provided with a plurality of branches;
   each of the plurality of branches has its own zero such that the self impedance of the shunt network remains within 135° electrical of the power wiring network self-impedance phase at any point in the power wiring network.

7. A method according to claim 1, wherein the shunt network is inserted in series between the first component and the second component.

8. A method according to claim 1, wherein, the shunt network, when loaded by the first component, has a parallel resonant frequency at or near a parallel resonant frequency of the first component and the second component.

9. A method according to claim 1, wherein the shunt network is composed of a group of networks; and
   at least one of the group of networks is composed of a plurality of capacitors.

10. A method according to claim 9, wherein capacitances of the plurality of capacitors span a narrow range using multiple successive E12 series values.

11. A method according to claim 1, wherein at least a portion of the shunt network is provided in or on an interposer.

12. A method according to claim 1, wherein at least a portion of the shunt network is provided in or on an interposer with wings.

13. A method according to claim 1, wherein at least a portion of the shunt network and the integrated circuit are provided in or on a single package.

14. A method according to claim 1, wherein at least a portion of the shunt network is provided in or on a circuit board to which the integrated circuit is to be mounted.

* * * * *